US012662921B2

(12) United States Patent
Cook

(10) Patent No.: US 12,662,921 B2
(45) Date of Patent: Jun. 23, 2026

(54) APPARATUS AND METHOD FOR FRACKING OPTIMIZATION

(71) Applicant: David Cook, Lakeway, TX (US)

(72) Inventor: David Cook, Lakeway, TX (US)

(73) Assignee: David Cook, Lakeway, TX (US)

( * ) Notice: Subject to any disclaimer, the term of this patent is extended or adjusted under 35 U.S.C. 154(b) by 0 days.

(21) Appl. No.: 19/173,662

(22) Filed: Apr. 8, 2025

(65) Prior Publication Data

US 2025/0237125 A1 Jul. 24, 2025

Related U.S. Application Data

(63) Continuation of application No. 18/436,806, filed on Feb. 8, 2024, now Pat. No. 12,270,286, which is a continuation-in-part of application No. 17/986,375, filed on Nov. 14, 2022, now Pat. No. 11,941,563.

(60) Provisional application No. 63/409,401, filed on Sep. 23, 2022.

(51) Int. Cl.
*E21B 43/26* (2006.01)
*G06F 30/27* (2020.01)
*G01V 1/40* (2006.01)

(52) U.S. Cl.
CPC .............. *E21B 43/26* (2013.01); *G06F 30/27* (2020.01); *E21B 2200/20* (2020.05); *E21B 2200/22* (2020.05); *G01V 1/40* (2013.01)

(58) Field of Classification Search
CPC ... E21B 43/26; E21B 2200/22; E21B 2200/20
See application file for complete search history.

(56) References Cited

U.S. PATENT DOCUMENTS

| | | | |
|---|---|---|---|
| 10,260,319 B2 * | 4/2019 | Sarduy | E21B 49/08 |
| 11,480,709 B2 * | 10/2022 | Thorne | G06N 5/04 |
| 11,846,175 B2 * | 12/2023 | Chaki | G01V 1/48 |
| 11,941,563 B1 * | 3/2024 | Cook | G06Q 50/02 |
| 12,056,726 B2 * | 8/2024 | Burton | G06N 20/00 |
| 12,217,140 B2 * | 2/2025 | Cook | G06N 20/00 |
| 12,270,286 B2 * | 4/2025 | Cook | G06F 30/27 |
| 2023/0012733 A1 * | 1/2023 | Xia | E21B 43/16 |
| 2024/0272320 A1 * | 8/2024 | AlShehri | E21B 47/117 |
| 2024/0309758 A1 * | 9/2024 | Steele | E21B 47/135 |
| 2025/0003325 A1 * | 1/2025 | Mesdour | E21B 41/00 |
| 2025/0231319 A1 * | 7/2025 | Temizel | G01V 20/00 |
| 2025/0237131 A1 * | 7/2025 | Khan | E21B 43/267 |

* cited by examiner

*Primary Examiner* — Kenneth L Thompson

(57) ABSTRACT

An apparatus and method for fracking optimization, wherein the apparatus includes at least a processor, and a memory, wherein the memory containing instructions configuring the at least a processor to receive a reservoir datum from at least a sensing device, generate a production training data include a plurality of reservoir datums as input correlated to a plurality of optimal production parameters as output, train a fracking optimization machine-learning model using the production training data, determine an optimal production parameter as a function of the fracking optimization machine-learning model, and generating an optimal production plan as a function of the optimal production parameter.

20 Claims, 8 Drawing Sheets

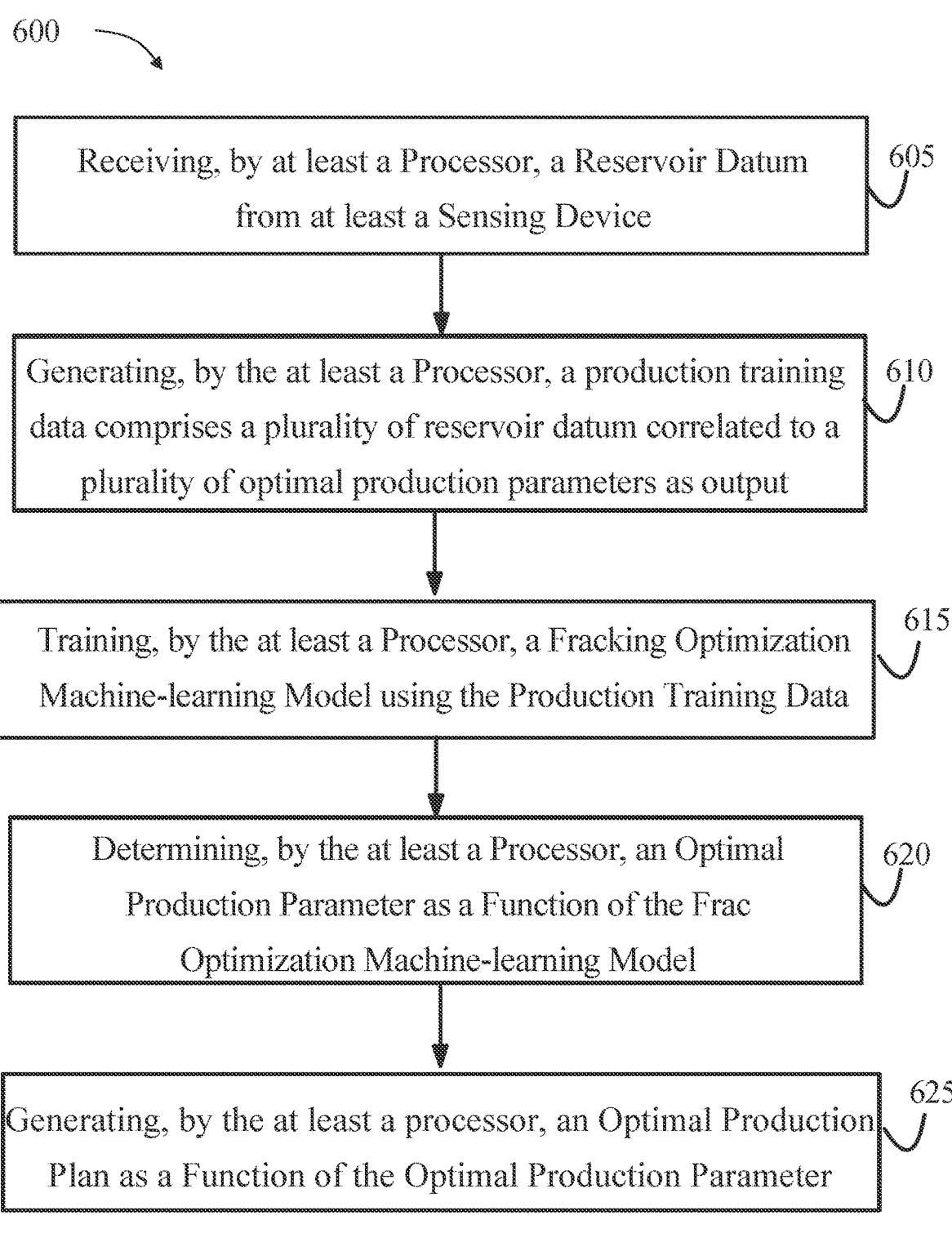

600

Receiving, by at least a Processor, a Reservoir Datum from at least a Sensing Device — 605

Generating, by the at least a Processor, a production training data comprises a plurality of reservoir datum correlated to a plurality of optimal production parameters as output — 610

Training, by the at least a Processor, a Fracking Optimization Machine-learning Model using the Production Training Data — 615

Determining, by the at least a Processor, an Optimal Production Parameter as a Function of the Frac Optimization Machine-learning Model — 620

Generating, by the at least a processor, an Optimal Production Plan as a Function of the Optimal Production Parameter — 625

FIG. 6

APPARATUS AND METHOD FOR FRACKING OPTIMIZATION

CROSS-REFERENCE TO RELATED APPLICATIONS

This application is a continuation of application Ser. No. 18/436,806, filed Feb. 8, 2024, which is a continuation-in-part of application Ser. No. 17/986,375, filed Nov. 14, 2022, which claims the benefit of Provisional Application No. 63/409,401, filed Sep. 23, 2022, the contents of each of which are incorporated by reference herein in their entirety.

FIELD OF THE INVENTION

The present invention generally relates to the field of natural resource extraction. In particular, the present invention is directed to an apparatus and method for fracking optimization.

BACKGROUND

There are significant differences in natural resource production after large-scale fracking of horizontal wells due to a plurality of reservoir properties. Fracking optimization is very important for low permeability reservoir stimulation and development in natural resource extraction. A solution for optimizing fracking process for maximizing natural resource production is needed. Existing solutions are not satisfactory.

SUMMARY OF THE DISCLOSURE

In an aspect, an apparatus for fracking optimization, wherein the apparatus includes at least a processor, and a memory communicatively connected to the at least a processor, the memory containing instructions configuring the at least a processor to receive a reservoir datum from at least a sensing device, generate a production training data include a plurality of reservoir datums as input correlated to a plurality of optimal production parameters as output, train a fracking optimization machine-learning model using the production training data, determine an optimal production parameter as a function of the fracking optimization machine-learning model, and generate an optimal production plan as a function of the optimal production parameter.

In another aspect, a method for fracking optimization, wherein the method includes receiving, by at least a processor, a reservoir datum from at least a sensing device, generating, by the at least a processor, a production training data includes a plurality of reservoir datum correlated to a plurality of optimal production parameters as output, training, by the at least a processor, a fracking optimization machine model using the production training data, determining, by the at least a processor, an optimal production parameter as a function of the fracking optimization machine-learning model, and generating, by the at least a processor, an optimal production plan as a function of the optimal production parameter.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention.

However, it should be understood that the present invention is not limited to the precise arrangements and instrumentalities shown in the drawings, wherein:

FIG. 6 is a flow diagram of an exemplary method for fracking optimization;

The drawings are not necessarily to scale and may be illustrated by phantom lines, diagrammatic representations, and fragmentary views. In certain instances, details that are not necessary for an understanding of the embodiments or that render other details difficult to perceive may have been omitted.

DETAILED DESCRIPTION

At a high level, aspects of the present disclosure are directed to systems and methods for fracking optimization, wherein the apparatus includes at least a processor, and a memory, wherein the memory containing instructions configuring the at least a processor to receive a reservoir datum from at least a sensing device, generate a production training data include a plurality of reservoir datums as input correlated to a plurality of optimal production parameters as output, train a fracking optimization machine-learning model using the production training data, determine an optimal production parameter as a function of the fracking optimization machine-learning model, and generating an optimal production plan as a function of the optimal production parameter.

In an embodiment, methods and apparatus described herein may perform or implement one or more aspects of fracking (i.e., frac). As used herein, "fracking," also known as hydraulic fracturing, is a process for extracting resources from the ground by inputting material into the ground such that previously trapped resources are released. In some embodiments, fracking may fracture bedrock formations using pressurized liquid. In a non-limiting example, fracking process may include injecting a high-pressure fracking fluid through a wellbore to create cracks in bedrock formations, wherein the high-pressure fracking fluid may primarily contain water. In some cases, fracking fluid may include one or more proppants. As used in this disclosure, a "proppant" is a solid material designed to keep an induced fracture open during fracking. In some cases, proppant may include sand, treated sand, man-made ceramic material, and the like thereof. When fracking fluid is removed from the well, small grains of proppant, such as, without limitation, sand, aluminum oxide, and/or the like may hold induced fractures open. Natural resources such as, without limitation, natural gas, petroleum, brine, and the like may flow more freely through induced fractures.

Figure 1:
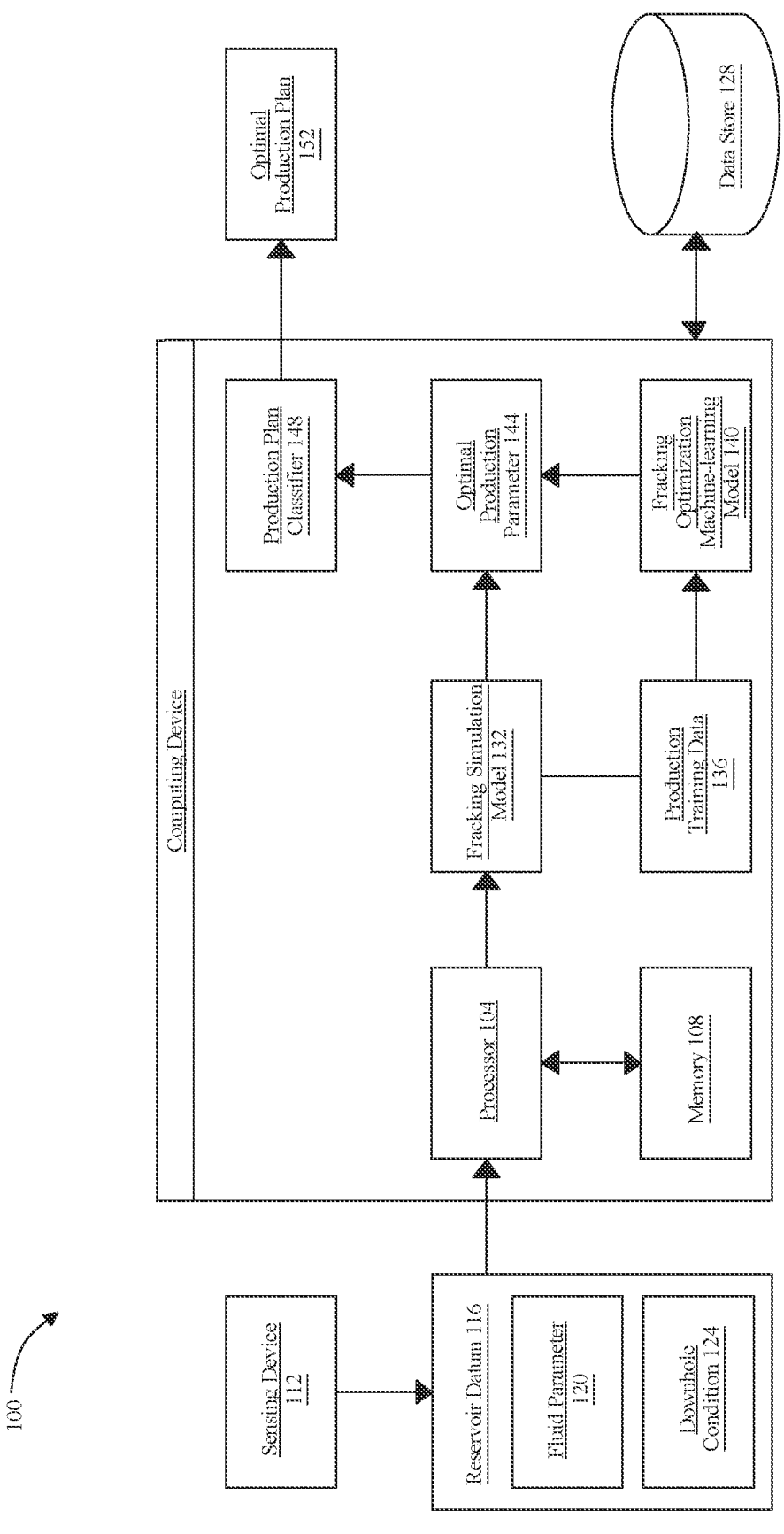
FIG. 1 is a block diagram of an exemplary embodiment of an apparatus for fracking optimization.

Referring now to FIG. 1, an exemplary embodiment of an apparatus 100 for fracking optimization is illustrated. Apparatus 100 includes at least a processor 104 and a memory 108 communicatively connected to the at least a processor. Processor 104 may include any computing device as described in this disclosure, including without limitation a microcontroller, microprocessor, digital signal processor (DSP) and/or system on a chip (SoC) as described in this disclosure. Computing device may include, be included in, and/or communicate with a mobile device such as a mobile telephone or smartphone. Processor 104 may include a single computing device operating independently, or may include two or more computing device operating in concert, in parallel, sequentially or the like; two or more computing devices may be included together in a single computing device or in two or more computing devices. Processor 104 may interface or communicate with one or more additional devices as described below in further detail via a network interface device. Network interface device may be utilized for connecting processor 104 to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus, or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Processor 104 may include but is not limited to, for example, a computing device or cluster of computing devices in a first location and a second computing device or cluster of computing devices in a second location. Processor 104 may include one or more computing devices dedicated to data storage, security, distribution of traffic for load balancing, and the like. Processor 104 may distribute one or more computing tasks as described below across a plurality of computing devices of computing device, which may operate in parallel, in series, redundantly, or in any other manner used for distribution of tasks or memory between computing devices. Processor 104 may be implemented using a "shared nothing" architecture in which data is cached at the worker, in an embodiment, this may enable scalability of apparatus 100 and/or computing device.

With continued reference to FIG. 1, processor 104 may be designed and/or configured to perform any method, method step, or sequence of method steps in any embodiment described in this disclosure, in any order and with any degree of repetition. For instance, processor 104 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Processor 104 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

With continued reference to FIG. 1, as used in this disclosure, "communicatively connected" means connected by way of a connection, attachment, or linkage between two or more relata which allows for reception and/or transmittance of information therebetween. For example, and without limitation, this connection may be wired or wireless, direct, or indirect, and between two or more components, circuits, devices, systems, apparatus and the like, which allows for reception and/or transmittance of data and/or signal(s) therebetween. Data and/or signals therebetween may include, without limitation, electrical, electromagnetic, magnetic, video, audio, radio and microwave data and/or signals, combinations thereof, and the like, among others. A communicative connection may be achieved, for example and without limitation, through wired or wireless electronic, digital or analog, communication, either directly or by way of one or more intervening devices or components. Further, communicative connection may include electrically coupling or connecting at least an output of one device, component, or circuit to at least an input of another device, component, or circuit. For example, and without limitation, via a bus or other facility for intercommunication between elements of a computing device. Communicative connecting may also include indirect connections via, for example and without limitation, wireless connection, radio communication, low power wide area network, optical communication, magnetic, capacitive, or optical coupling, and the like. In some instances, the terminology "communicatively coupled" may be used in place of communicatively connected in this disclosure.

With continued reference to FIG. 1, apparatus 100 includes at least a sensing device 112. As used in this disclosure, a "sensing device" is a component that is configured to detect a phenomenon and transmit information related to the detection of the phenomenon. In an embodiment, sensing device may include one or more sensors. For example, a sensor may transduce a detected phenomenon, such as without limitation, current, speed, direction, force, torque, moisture, temperature, pressure, geographic location, resistance, touch sensors, viscosity, fluid state, fluid density, and the like, into a sensed signal. In some embodiments, sensing device 112 may include one or more sensors which may be the same, similar, or different. In other embodiments, sensing device 112 may include one or more sensor suites with sensors in each sensor suite being the same, similar, or different. In a non-limiting example sensing device 112 may include a plurality of sensors disposed downhole, particularly along a borehole of a well. Borehole may be horizontal or vertical. Each sensor of plurality of sensors may be equidistant from its neighboring sensors. Additionally, or alternatively, sensing device 112 may include sensor such as, without limitation, temperature sensor, accelerometer, gyro meter, pressure sensor, GPS, speed gauge, voltage sensors, current sensors, ohm sensors, touch sensors, viscosity sensor, motion sensor, density sensor, flow rate sensor, downhole gauge, electricity usage meter, multimeters, a carbon emissions sensor, natural gas sensor, image sensor, scale, materials sensor, micro seismic geophones, fiber optic sensors, radiation sensors, rotational sensors, venturi flow meters, and the like thereof. In some cases, one or more sensing device 112 may be disposed in one or more nearby wellbores (i.e., wellbores proximate to a target wellbore) to gather additional data. In some cases, data related to one or more interactions between different wellbores may be collected by at least a sensing device 112.

With continued reference to FIG. 1, in some embodiments, sensing device 112 may include a seismic sensor. As used in this disclosure, a "seismic sensor" is a sensor with the capability of detecting ground noise and movement. In a non-limiting example, seismic sensor may respond to ground noises and shaking such as caused by earthquakes, volcanic eruptions, explosions, fracking, and the like thereof. In some embodiment, seismic sensor may include a component that converts ground movement into a voltage measurement (volt), wherein the voltage measurement is a difference in electric potential (in a static electric field) between two points. Voltage measurement may be stored in data store 128, as described in further detail below. In a non-limiting example, sensing device 112 may include a geophone with sensitivity of 30 volts per meter per second, wherein the geophone is configured to measure a ground motion during fracking and convert the ground motion into a voltage measurement, wherein the voltage measurement may be used to determine a seismic response through comparison of voltage measurement to its baseline/which may then be used to analyze downhole condition 124 described below in this disclosure. In some embodiments, sensing device 112 may include an injection/flow back sensor, wherein the injection/flow back sensor may be configured to measure data regarding to reservoir such as, without limitation, fluid flow, fluid flow rate, fluid pressure, and the like before and/or after fracking process through controlling a fluid in the wellbore. In a non-limiting example, a fluid may be inject into a stage and flew back and a first fluid flow may be measured by injection/flow back sensor. A second fluid flow may be measured using injection/flow back sensor in the same manner after fracking process, wherein the second fluid flow may be different than first fluid flow. In other embodiments, sensing device 112 may include a diagnostic fracture injection (DFI) sensor which is similar to injection/flow back sensor described above. Additionally, or alternatively, sensing device 112 may include a fiber optic sensor, wherein the fiber optic sensor may be configured to measure vibration and/or temperature changes underground. In a non-limiting example, sensing device 112 may include a plurality of fiber optic sensors placed in a string, wherein the string may run in a well casing. Plurality of fiber optic sensors may measure a temperature change outside of well casing. Plurality of fiber optic sensor may further measure a fluid movement within well casing during production. Further, sensing device 112 may include downhole condition sensor; for instance, downhole condition sensor may be consistent with any downhole condition sensor disclosed in Non-provisional application Ser. No. 17/968,077 filed on Oct. 18, 2022, and entitled "APPARATUS AND METHOD FOR PREDICTING DOWNHOLE CONDITIONS," the entirety of which is incorporated herein by reference. Persons skilled in the art, upon reviewing the entirety of this disclosure, will be aware of the various embodiments of sensing device 112.

With continued reference to FIG. 1, as used in this disclosure, a "signal" is any intelligible representation of data, for example from one device to another. A signal may include an optical signal, a hydraulic signal, a pneumatic signal, a mechanical, signal, an electric signal, a digital signal, an analog signal and the like. In some cases, a signal may be used to communicate with a computing device, for example by way of one or more ports. In some cases, a signal may be transmitted and/or received by a computing device for example by way of an input/output port. An analog signal may be digitized, for example by way of an analog to digital converter. In some cases, an analog signal may be processed, for example by way of any analog signal processing steps described in this disclosure, prior to digitization. In some cases, a digital signal may be used to communicate between two or more devices, including without limitation computing devices. In some cases, a digital signal may be communicated by way of one or more communication protocols, including without limitation internet protocol (IP), controller area network (CAN) protocols, serial communication protocols (e.g., universal asynchronous receiver-transmitter [UART]), parallel communication protocols (e.g., IEEE 128 [printer port]), and the like.

With continued reference to FIG. 1, in some cases, apparatus 100 may perform one or more signal processing steps on a signal. For instance, apparatus 100 may analyze, modify, and/or synthesize a signal representative of data in order to improve the signal, for instance by improving transmission, storage efficiency, or signal to noise ratio. Exemplary methods of signal processing may include analog, continuous time, discrete, digital, nonlinear, and statistical. Analog signal processing may be performed on non-digitized or analog signals. Exemplary analog processes may include passive filters, active filters, additive mixers, integrators, delay lines, compandors, multipliers, voltage-controlled filters, voltage-controlled oscillators, and phase-locked loops. Continuous-time signal processing may be used, in some cases, to process signals which varying continuously within a domain, for instance time. Exemplary non-limiting continuous time processes may include time domain processing, frequency domain processing (Fourier transform), and complex frequency domain processing. Discrete time signal processing may be used when a signal is sampled non-continuously or at discrete time intervals (i.e., quantized in time). Analog discrete-time signal processing may process a signal using the following exemplary circuits sample and hold circuits, analog time-division multiplexers, analog delay lines and analog feedback shift registers. Digital signal processing may be used to process digitized discrete-time sampled signals. Commonly, digital signal processing may be performed by a computing device or other specialized digital circuits, such as without limitation an application specific integrated circuit (ASIC), a field-programmable gate array (FPGA), or a specialized digital signal processor (DSP). Digital signal processing may be used to perform any combination of typical arithmetical operations, including fixed-point and floating-point, real-valued and complex-valued, multiplication and addition. Digital signal processing may additionally operate circular buffers and lookup tables.

With continued reference to FIG. 1, in some embodiments, processor 104 may be remote to sensing device 112 and communicatively connected with sensing device 112 by way of one or more networks. Network may include, but not limited to, a cloud network, a mesh network, or the like. By way of example, a "cloud-based" system, as that term is used herein, can refer to a system which includes software and/or data which is stored, managed, and/or processed on a network of remote servers hosted in the "cloud," e.g., via the Internet, rather than on local severs or personal computers. A "mesh network" as used in this disclosure is a local network topology in which the processor 104 and/or biological sensor connect directly, dynamically, and non-hierarchically to as many other computing devices as possible. A "network topology" as used in this disclosure is an arrangement of elements of a communication network. In a non-limiting example, a processor 104 may send instructions of any processing step described in this disclosure to a sensing device 112 through a wireless wide area network, wherein the processor 104 and the sensing device 112 may be connected to the wireless wide area network. Processor 104 may further receive, without limitation, any data, information, signals, and/or the like described in this disclosure from sensing device 112 through wireless wide area network.

With continued reference to FIG. 1, processor 104 is configured to receive a reservoir datum 116 from at least a sensing device 112. As used in this disclosure, "receive" means to accept, collect, or otherwise receive reservoir datum 116 from at least a sensing device 112. Sensing device 112 may be any sensing device or sensor described in this disclosure. In a non-limiting example, sensing device 112 may include one or more sensors configured to measure reservoir datum 116 and transmit measured reservoir datum 116 as one or more signals to processor 104. Processor 104 may accept these signals and perform any signal processing steps described in this disclosure on these signals. As used in this disclosure, a "reservoir datum" is an element of data related to a reservoir. As used in this disclosure, a "reservoir" is the formation of rock in which natural resources has accumulated. In some cases, reservoir datum 116 may include one or more quantitative measurements measured using sensing device 112 described above such as, without limitation, fluid flow rate, fluid pressure, formation pressure, temperature, and the like thereof. In other cases, reservoir datum 116 may include one or more quantitative measurements from geological exploration such as, without limitation, water exploration, rock exploration, mineral exploration, and the like thereof. Such quantitative measurements may include shale volume, gross and net thickness of the drilled layers, rock elastic moduli, permeability measurement, depth measurement, any quantity represents one or more aspects of the reservoir, and the like thereof. In some cases, reservoir datum 116 may include one or more graphical data of the reservoir. In a non-limiting example, reservoir datum 116 may include a seismic graph, wherein the seismic graph is a geological graph of the reservoir observed in different levels. Seismic graph may include reservoir geometry, structural features, and the like thereof. In other embodiments, reservoir datum 116 may further include other type of data describing the reservoir such as, without limitation, historical migration, type of geological trap, reservoir heterogeneity, and the like thereof. In some embodiments, receiving reservoir datum 116 from at least a sensing device 112 may include collecting reservoir datum from, without limitation, seismic survey, well log, conventional and special core analyses, fluid analyses, pressure-transient test, periodic well production test, and the like thereof. Additionally, or alternatively, reservoir datum 116 may be stored in data store 128. Data store disclosed here will be described in further detail below. In a non-limiting example, receiving reservoir datum 116 may include retrieving reservoir datum 116 from data store 128. Persons skilled in the art, upon reviewing the entirety of this disclosure, will be aware of the various ways of reservoir data acquisition.

With continued reference to FIG. 1, reservoir datum 116 may include temporal information. As used in the current disclosure, "temporal information" refers to time analyzed with respect to a received reservoir datum. Temporal information may reference to stage of the fracking process in which the well being evaluated. In a non-limiting example, receiving reservoir datum 116 may include generating a time structure map of the reservoir by picking time horizons from image volumes (i.e., graphical data) from 3-D post time migration obtained through sensing device 112. Additionally, or alternatively, reservoir datum 116 may include a pre-fracking reservoir datum 116 and/or a post-fracking reservoir datum. As used in this disclosure, a "pre-fracking reservoir datum" is reservoir datum received prior to fracking. As used in this disclosure, a "post-fracking reservoir datum" is reservoir datum received during and/or after fracking. Reservoir datum may include any reservoir datum described in this disclosure. In some embodiments, reservoir datum may include data related to the reservoir derived from pre-fracking reservoir datum and/or post-fracking reservoir datum. In a non-limiting example, an oil flow rate may be estimated by comparing post-fracking reservoir datum such as, without limitation, post oil reserves to pre-fracking reservoir datum such as, without limitation, pre oil reserves.

With continued reference to FIG. 1, reservoir datum 116 may further include a fluid parameter 120. As used in this disclosure, a "fluid parameter" is a datum related to the output fluid of the well. Output fluid may include, without limitation, fracking fluid, oil, natural gas, and the like thereof. In a non-limiting example, sensing device 112 may be configured to measure reservoir datum containing fluid parameters such as, without limitation, fluid flow, fluid flow rate, leakoff coefficients, pump rate, fluid viscosity, fluid temperature, fluid state (i.e., liquid, solid, or gas), fluid depth, fluid pressure, fluid composition, and the like thereof. In some cases, fluid parameter 120 within reservoir datum 116 may be manually collected through a fluid experiment. In a non-limiting example, a plurality of fluid parameters may be received by performing a PVT study in a lab. Plurality of fluid parameters may include, without limitation, initial system composition, bubble point pressure, volume of oil, volume and composition of the gas, oil viscosity, and the like there of.

With continued reference to FIG. 1, reservoir datum 116 may further include a downhole condition 124. As used in the current disclosure, "downhole condition" refers to any event or status that occurs downhole. Examples of downhole conditions may include temperature, pressure, force, motion, and the like. Downhole condition 124 may be measured using sensing device 112 described in this disclosure. Measured downhole conditions may be taken from wells that are similarly situated to the target well. Well may be similarly situated as a function of condition datum, well geography, or other circumstances. In an embodiment, downhole conditions 124 may include hydrostatic pressure, formation pressure, fracture pressure, bottomhole pressure, formation integrity test, equivalent circulating densities, differential pressure, bottomhole fracking gradient, pressure transients, rate transients, and the like. Downhole condition 124 may further include a future downhole condition, wherein the future downhole condition is projected downhole condition of the well in the future. In a non-limiting example, downhole condition, measured downhole condition, and future downhole condition in the current disclosure may be consistent with any downhole condition, measured downhole condition, and predicted downhole condition disclosed in Non-provisional application Ser. No. 17/968,077 filed on Oct. 18, 2022, and entitled "APPARATUS AND METHOD FOR PREDICTING DOWNHOLE CONDITIONS," the entirety of which is incorporated herein by reference.

With continued reference to FIG. 1, in one or more embodiments, processor 104 may be configured to receive a plurality of reservoir datums 116 from a full sensor suite, wherein the plurality of reservoir datums 116 may include at least one surface reservoir datum detected using a first sensor of the full sensor suite and at least one downhole reservoir datum detected using a second sensor of the full sensor suite. As used herein, a "full sensor suite" is a collection of a plurality of sensing device as described herein. In a non-limiting example, full sensor suite may include one or more sensor arrays. In some cases, each sensor within the full sensor suite may not work together or have the same functionalities, nor do they necessarily operate at the same location. In an embodiment, first sensor of the full sensor suite may include a surface sensor and second sensor of the full sensor suite may include a downhole sensor. As used herein, a "surface sensor" is a sensor configured to gather information while not underground. In some embodiments, surface sensor may be configured to collect related data points above well; for instance, and without limitation, surface temperature, pressure data within the wellbore at the surface, environmental data, and the like. In other embodiments, surface sensor may be configured to gather information from a depth of no more than 500 ft, 1000 ft, 1500 ft, 2000 ft, 2500 ft, 3000 ft, 3500 ft, 4000 ft, 4500 ft, 5000 ft, 5500 ft, 6000 ft, 6500 ft, 7000 ft, 7500 ft, 8000 ft, 8500 ft, 9000 ft, 9500 ft, or 10000 ft. As used herein, a "downhole sensor" is a sensor configured to gather information while the sensor is underground. In some embodiments, a downhole sensor may be configured to gather information while in a borehole. In some embodiments, a downhole sensor may be configured to gather information from a depth of at least 500 ft, 1000 ft, 1500 ft, 2000 ft, 2500 ft, 3000 ft, 3500 ft, 4000 ft, 4500 ft, 5000 ft, 5500 ft, 6000 ft, 6500 ft, 7000 ft, 7500 ft, 8000 ft, 8500 ft, 9000 ft, 9500 ft, 10000 ft, or more.

With continued reference to FIG. 1, as used herein, a "surface reservoir datum" is a reservoir datum captured using a surface sensor. In some cases, surface reservoir datum may be captured using surface sensors and relate to measurements that can be taken from surface or near the surface level. Exemplary embodiments of surface reservoir datum includes, without limitation, seismic activity measurements, acoustic signals, pressure and flow rates at the wellhead, temperature readings of fluids and gases as they exist the well, and environmental monitoring data. As used herein, a "downhole reservoir datum" is a reservoir datum captured using a downhole sensor. In some cases, downhole sensor may be located within the borehole or embedded in the well infrastructure. Exemplary embodiments of downhole sensor datum includes, without limitation, underground pressure measurements, temperature readings at different depts, formation density, porosity and permeability data, resistivity measurements, and/or the like. As a person skilled in the art, upon reviewing the entirety of this disclosure, will be aware of various surface reservoir datums and/or downhole reservoir datum may be received by apparatus 100 for determination of optimal production parameters as described in further detail below.

Still referring to FIG. 1, in some embodiments, a surface sensor may include a geophone. A geophone may be used to record seismic activity. A geophone may be placed, for example, on the surface to monitor micro seismic events during fracking. In some embodiments, a surface sensor may include a pressure gauge. A pressure gauge may be used to, for example, monitor pressure in various parts of surface equipment such as pumps, lines, and separators during flow back. In some embodiments, a surface sensor may include a temperature gauge. A temperature gauge may be used to measure temperature in one or more surface lines which may, for example, inform thermodynamic calculations, indicate flow characteristics or potential blockages. In some embodiments, a surface sensor may include a flow meter. A flow meter may be used to measure a rate of fluid injected into or produced from a well. A flow meter may include a mass flow meter, which may be used, for example, for gases. A flow meter may include a liquid flow meter. A flow meter may include a Coriolis flow meter. In some embodiments, a Coriolis flow meter may provide mass flow rate measurements which are less affected by changes in temperature, pressure, or fluid composition than other types of meters. In some embodiments, a surface sensor may include a proppant monitor. A proppant monitor may include one or more sand screws which lift proppant from a hopper and dump it into a blender tub. In some embodiments, a hopper may include a mass/rotation metric which through a calculation may track proppant concentration within fracturing fluids. These may be spun at a rate which loads proppant into a fracturing fluid to match a frac design. In some embodiments, a surface sensor may include a depth measurement tool. A depth measurement tool may determine a depth of a downhole tool or sensor during operations such as wireline logging or coiled tubing interventions. In some embodiments, a surface sensor may include a fluid density meter. A fluid density meter may measure density of fluids. Fluid density information may be used to understand, for example, downhole pressures, fluid dynamics, proppant carrying capacity and fluid behavior under downhole conditions. In some embodiments, a surface sensor may include a viscosity meter. A viscosity meter may monitor fluid viscosity, which may affect creation and/or proppant transport. In some embodiments, a surface sensor may include a resistivity meter. A resistivity meter may be used to assess electrical resistivity of fluids, which can, for example, indicate contamination or mixing with formation fluids. In some embodiments, a surface sensor may include chromatographic tools, which may be used to analyze a chemical composition of injected or produced fluids. Such chemical composition analysis may be performed in real time.

Still referring to FIG. 1, in some embodiments, a downhole sensor may include a fiber optic sensor. A fiber optic sensor may be used to measure temperature, pressure, strain, and/or acoustic vibrations. A fiber optic sensor may make use of Distributed Acoustic Sensing (DAS) and/or Distributed Temperature Sensing (DTS) techniques. In some embodiments, a downhole sensor may include a geophone. A geophone may be used to record seismic activity. A geophone may be placed, for example, in an observation well, downhole in a target well. In some embodiments, a downhole sensor may include a pressure sensor, a temperature sensor, and/or a force sensor. Pressure, temperature, and/or force sensors may monitor pressure, temperature, and mechanical forces within a wellbore on a live communication wire and/or more commonly on a memory gauge which may be retrieved after an operation. A downhole sensor may include an electromagnetic sensor. An electromagnetic sensor may measure properties such as resistivity around a wellbore and/or electric potential of fluids in a wellbore. A downhole sensor may include a camera. A camera may allow for a visual inspection of well integrity and frac sand placement. A camera may be used to confirm features observed by other sensors. In some embodiments, a machine vision system may be used to analyze image data captured by one or more cameras as described below. In some embodiments, chemical tracers may be injected into fracking fluid at different stages to track fracture propagation and allow for flowback analysis. Chemical tracers may be used to narrow down variables in feature analysis by helping to understand which stage is flowing back to surface. In some embodiments, machine learning may be used to perform such feature analysis. In some embodiments, an Inflow Control Device (ICD) may be used to help manage the rate of fluid entering a wellbore from different sections of a reservoir. In some embodiments, an acoustic emission sensor may be used to detect sounds emitted by fractures as they propagate through rock formations or sound emitted by fluids flowing through an orifice. In some embodiments, a downhole sensor may detect particle radiation. For example, radioactive tracers may be injected into a well, and may emit particles such as alpha particles, beta particles, or neutrons. Such emissions may be detected by a downhole sensor and analyzed to provide information about subsurface conditions. For example, this information may be used to determine where a fracture grew outside of a wellbore. In some embodiments, a downhole sensor may detect electromagnetic radiation such as by using spectroscopy tools. For example, a downhole sensor may detect gamma rays, which are capable of penetrating into rock formations.

With continued reference to FIG. 1, processor 104 is further configured to generate production training data 136. As used in this disclosure, "production training data" is training data used to train a fracking optimization machine learning model. Fracking optimization machine-learning model is described in further detail below. As used in this disclosure, "training data" is data containing correlations that a machine-learning process may use to model relationships between two or more categories of data elements. In a non-limiting example, production training data 136 may include a plurality of reservoir datums as input correlated to a plurality of optimal production parameters as output. Reservoir datum may include, without limitation, pre-fracking and post-fracking reservoir datum, fluid parameter 120, downhole condition 124, any reservoir datum described in this disclosure, and the like thereof. As used in this disclosure, an "optimal production parameter" is a most appropriate production parameter of a well that enables maximum production of the well. As used in this disclosure, a "production parameter" is a parameter for well placement and operation. In some cases, production parameters may include, without limitation, drilling depth, well location, proximity of fractures, quantity of fractures, fracking fluid pressure, fracking fluid flow rates, and the like thereof. In some embodiments, deploying optimal production parameter for a selected well may maximize production of natural resources of the selected well. In a non-limiting example, optimal production parameter 144 may include an optimal drill coordinate, wherein the optimal drill coordinates may determine the best location of the well. Continuing the non-limiting example, optimal production parameter 144 may include an optimal drill depth, wherein the optimal drill depth may determine the best horizontal level at which to perform the fracking process in order to utilize the well to extract the majority of the natural resources at optimal drill coordinate.

With continued reference to FIG. 1, in some embodiments, processor 104 may be configured to store production training data in a data store 128 such as, without limitation, a database. In other embodiments, generating production training data 136 may include retrieving production training data 136, reservoir datum 116, optimal production parameter 144, and/or the like from data store 128 such as, without limitation, a database. Database may be implemented, without limitation, as a relational database, a key-value retrieval database such as a NOSQL database, or any other format or structure for use as a database that a person skilled in the art would recognize as suitable upon review of the entirety of this disclosure. Database may alternatively or additionally be implemented using a distributed data storage protocol and/or data structure, such as a distributed hash table or the like. Database may include a plurality of data entries and/or records as described above. Data entries in a database may be flagged with or linked to one or more additional elements of information, which may be reflected in data entry cells and/or in linked tables such as tables related by one or more indices in a relational database. Persons skilled in the art, upon reviewing the entirety of this disclosure, will be aware of various ways in which data entries in a database may store, retrieve, organize, and/or reflect data and/or records as used herein, as well as categories and/or populations of data consistently with this disclosure.

With continued reference to FIG. 1, in an embodiment, generating production training data 136 may include applying a fracking simulation model 132 as a function of the reservoir datum 116 and calculating optimal production parameter 144 as a function of the fracking simulation model 132. As used herein, "applying" a computational model is inputting at least a first element of data into the computational model and receiving at least a second element of data from the computational model. In some embodiments, reservoir datum 116 may be input into fracking simulation model 132. In some embodiments, fracking simulation model 132 may include one or more mathematical equations. As used herein, a "fracking simulation model" is a computational model that represents a fracking process. In some embodiments, fracking simulation model may be configured to output one or more production parameters such as, without limitation, rock deformation, reservoir pressure, fracture propagation and the like as a function of one or more reservoir data 116. In a non-limiting example, fracking simulation model 132 may be configured to calculate a rock deformation as a function of reservoir datum 116 such as, without limitation, movement of particles or blocks within the reservoir using an elastoplastic behavior such as, without limitation, linear elasticity. In a non-limiting example, fracking simulation model 132 may be configured to simulate a fluid flow in a fracture by implementing lubrication theory using Poiseuille's law that relate fluid parameter 120 such as, without limitation, fluid flow rate and downhole condition 124 such as, without limitation, pressure gradient along the fracture and calculate a fluid flow rate using the simulation. In a non-limiting example, fracking simulation model 132 may be configured to calculating a fracture propagation by employing a linear elastic fracture mechanics (LEFM), wherein the linear elastic fracture mechanics may include a LEFM criteria which includes an evaluation of a plurality of reservoir datums. Evaluation of plurality of reservoir datums may include, without limitation, maximum tensile stress criterion, minimum strain energy density criterion, maximum principal strain criterion, maximum strain criterion, and the like. In other embodiments, fracking simulation model may be configured to output one or more other production parameter such as, without limitation, proppant transportation, leakoff coefficient, and the like thereof. Persons skilled in the art, upon reviewing the entirety of this disclosure, will be aware of the various production parameters and ways of calculating production parameters using fracking simulation model.

With continued reference to FIG. 1, in some embodiments, generating production training data 136 may include manually collecting production training data 136 by a user. In some cases, user may include a professional, engineer, operator, any individual who uses apparatus 100 for fracking optimization, and the like thereof. In other cases, user may include a group of people, such as, without limitation, team, enterprise, and the like thereof. In a non-limiting example, generating production training data 136 may include user gathering a historical production training data, wherein the historical production training data may include a plurality of historical reservoir datums as input correlated to a plurality of historical optimal production parameters. As used in this disclosure, a "historical reservoir datum" is reservoir datum related to a historical reservoir; for instance, historical reservoir datum may include reservoir datum received from an existing and/or currently operating well prior and/or after fracking. As used in this disclosure, a "historical optimal production parameter" is optimal production parameter adopted for a historical production of a well; for instance, historical optimal production parameter may include one or more historical optimal production parameters used on existing and/or currently operating well during fracking, well construction, well production, well maintenance, and the like thereof. Historical production training data may be stored in and/or retrieved from data store 128 described above in this disclosure.

With continued reference to FIG. 1, generating production training data may include identifying a plurality of correlational patterns between at least one surface reservoir datum and at least one downhole reservoir datum. As used in this disclosure, "correlation patterns" are statistically significant relationships that indicate how changes in at least two data points (e.g., surface and downhole conditions) can affect the efficiency and outcomes of one or more fracking operations as described herein. In a non-limiting example, processor 104 may be configured to identify one or more relationships between the pressure and flow rate at the surface and various geological features detected by downhole sensors, such as rock density, porosity, and/or temperature gradients. In some cases, fracking simulation model may be configured to generate a plurality of optimal production parameters 144 such as, without limitation, drilling depth, well location, proximity of fractures, quantity of fractures, fracking fluid pressure, fracking fluid flow rates as described above based on plurality of reservoir datums. Production training data may be generated by pairing or correlating each correlation pattern with one or more optimal production parameters 144 such as, without limitation, the volume and composition of fracking fluid, pressure applied during injection, operational settings at different fracking stages. In some cases, such pairing may be based on historical optimal production parameters 144, simulation outcomes, real-time operational data, and/or the like aiming to identify the set of conditions and actions that lead to the most appropriate and efficient extraction of natural resources with minimal environmental impact and operational cost.

With continued reference to FIG. 1, in some embodiments, generating production training data 136 may further include converting reservoir datum 116 and optimal production parameter 144 into a cleansed data format using a data conversion module. As used in this disclosure, a "cleansed data format" is a format and/or structure for data where the data is transformed from an unprocessed format and/or structure into a processed format and/or structure that is prepared for use in the generation and training of an artificial intelligence (AI) model, for example a machine learning model, a neural network, and the like. Reservoir datum 116 that is placed into a cleansed data format may be referred to as a cleansed reservoir datum. Similarly, optimal production parameter 144 that is placed in a cleansed data format may be referred to as cleansed measured downhole conditions. A cleansed data format may be used to ensure data used for the generating and training of the AI model is relevant and accurate to generate an optimal AI model. A cleansed data format may also include data that is transformed by constructive transformation, destructive transformation, and/or structural transformation into the process format and/or structure. In some embodiments, constructive transformation of data may include adding data, replicating data, and the like. In some embodiments, destructive transformation of data may include fixing or removing incorrect, corrupted, incorrectly formatted, duplicate, or incomplete data within a dataset, and the like. In some embodiments, structural transformation of data may include moving and/or combining columns of data in a data set, and the like. The converting of data may include the processing, cleansing, standardizing, and categorizing of data into a cleansed data format for use in generating an accumulated artificial intelligence (AI) model. In an embodiment, the conversion of reservoir datum 116 and optimal production parameter 144 may include the processing, cleansing, and standardizing of data into a data set and/or data bucket for use in generating an artificial intelligence model The conversion of data into a cleansed data format in the current disclosure may be consistent with the conversion of data into a cleansed data format disclosed in Non-provisional application Ser. No. 17/853,143 filed on Jun. 29, 2022 and entitled "APPARATUS AND METHOD FOR GENERATING A COMPILED ARTIFICIAL INTELLIGENCE (AI) MODEL," the entirety of which is incorporated herein by reference.

Still referring to FIG. 1, in some embodiments, apparatus 100 may include at least a camera. As used in this disclosure, a "camera" is a device that is configured to sense electromagnetic radiation, such as without limitation visible light, and generate an image representing the electromagnetic radiation. In some cases, a camera may include one or more optics. Exemplary non-limiting optics include spherical lenses, aspherical lenses, reflectors, polarizers, filters, windows, aperture stops, and the like. In some cases, at least a camera may include an image sensor. Exemplary non-limiting image sensors include digital image sensors, such as without limitation charge-coupled device (CCD) sensors and complimentary metal-oxide-semiconductor (CMOS) sensors, chemical image sensors, and analog image sensors, such as without limitation film. In some cases, a camera may be sensitive within a non-visible range of electromagnetic radiation, such as without limitation infrared. As used in this disclosure, "image data" is information representing at least a physical scene, space, and/or object. In some cases, image data may be generated by a camera. "Image data" may be used interchangeably through this disclosure with "image," where image is used as a noun. An image may be optical, such as without limitation where at least an optic is used to generate an image of an object. An image may be material, such as without limitation when film is used to capture an image. An image may be digital, such as without limitation when represented as a bitmap. Alternatively, an image may be comprised of any media capable of representing a physical scene, space, and/or object. Alternatively, where "image" is used as a verb, in this disclosure, it refers to generation and/or formation of an image.

Still referring to FIG. 1, in some embodiments, apparatus 100 may include a machine vision system. In some embodiments, a machine vision system may include at least a camera. A machine vision system may use images, such as images from at least a camera, to make a determination about a scene, space, and/or object. For example, in some cases a machine vision system may be used for world modeling or registration of objects within a space. In some cases, registration may include image processing, such as without limitation object recognition, feature detection, edge/corner detection, and the like. Non-limiting example of feature detection may include scale invariant feature transform (SIFT), Canny edge detection, Shi Tomasi corner detection, and the like. In some cases, registration may include one or more transformations to orient a camera frame (or an image or video stream) relative a three-dimensional coordinate system; exemplary transformations include without limitation homography transforms and affine transforms. In an embodiment, registration of first frame to a coordinate system may be verified and/or corrected using object identification and/or computer vision, as described above. For instance, and without limitation, an initial registration to two dimensions, represented for instance as registration to the x and y coordinates, may be performed using a two-dimensional projection of points in three dimensions onto a first frame, however. A third dimension of registration, representing depth and/or a z axis, may be detected by comparison of two frames; for instance, where first frame includes a pair of frames captured using a pair of cameras (e.g., stereoscopic camera also referred to in this disclosure as stereo-camera), image recognition and/or edge detection software may be used to detect a pair of stereoscopic views of images of an object; two stereoscopic views may be compared to derive z-axis values of points on object permitting, for instance, derivation of further z-axis points within and/or around the object using interpolation. This may be repeated with multiple objects in field of view, including without limitation environmental features of interest identified by object classifier and/or indicated by an operator. In an embodiment, x and y axes may be chosen to span a plane common to two cameras used for stereoscopic image capturing and/or an xy plane of a first frame; a result, x and y translational components and ø may be pre-populated in translational and rotational matrices, for affine transformation of coordinates of object, also as described above. Initial x and y coordinates and/or guesses at transformational matrices may alternatively or additionally be performed between first frame and second frame, as described above. For each point of a plurality of points on object and/or edge and/or edges of object as described above, x and y coordinates of a first stereoscopic frame may be populated, with an initial estimate of z coordinates based, for instance, on assumptions about object, such as an assumption that ground is substantially parallel to an xy plane as selected above. Z coordinates, and/or x, y, and z coordinates, registered using image capturing and/or object identification processes as described above may then be compared to coordinates predicted using initial guess at transformation matrices; an error function may be computed using by comparing the two sets of points, and new x, y, and/or z coordinates, may be iteratively estimated and compared until the error function drops below a threshold level. In some cases, a machine vision system may use a classifier, such as any classifier described throughout this disclosure.

Still referring to FIG. 1, an exemplary machine vision camera is an OpenMV Cam H7 from OpenMV, LLC of Atlanta, Georgia, U.S.A. OpenMV Cam comprises a small, low power, microcontroller which allows execution of machine vision applications. OpenMV Cam comprises an ARM Cortex M7 processor and a 640×480 image sensor operating at a frame rate up to 150 fps. OpenMV Cam may be programmed with Python using a Remote Python/Procedure Call (RPC) library. OpenMV CAM may be used to operate image classification and segmentation models, such as without limitation by way of TensorFlow Lite; detection motion, for example by way of frame differencing algorithms; marker detection, for example blob detection; object detection, for example face detection; eye tracking; person detection, for example by way of a trained machine learning model; camera motion detection, for example by way of optical flow detection; code (barcode) detection and decoding; image capture; and video recording.

Still referring to FIG. 1, in some embodiments, production training data 136 may be generated as a function of a fracking simulation model. In some embodiments, training data used to train fracking optimization machine learning model 140 may include input data from full sensor suite associated with output data from a fracture simulation. In some embodiments, fracking optimization machine learning model 140 may be trained on training data including reservoir analysis datum. As used herein, a "reservoir analysis datum" is a datum describing a fracking parameter, where the datum is produced at least in part through human analysis of a downhole reservoir datum. As described further below, fracking optimization machine learning model 140 may be trained on production training data 136. Fracking optimization machine learning model 140 may be used to determine an optimal production parameter 144. In some embodiments, determining an optimal production parameter may not include analysis of a surface reservoir datum using a fracking simulation model. In some embodiments, a fracking simulation model is used only for fracking optimization machine learning model 140 training, such as training data generation, and is not used in determining an optimal production parameter 144.

With continued reference to FIG. 1, processor 104 is further configured to train a fracking optimization machine-learning model 140 using production training data 136. As used in the current disclosure, a "fracking optimization machine learning model" is a mathematical and/or algorithmic representation of a relationship between inputs and outputs. Fracking optimization machine-learning model 140 may be similar to the machine learning model mentioned herein below in FIG. 2. Inputs to the to the fracking optimization machine-learning model 140 may include, without limitation, reservoir datum 116, pre-fracking reservoir datum, post-fracking reservoir datum, fluid parameter 120, downhole condition 124, and the like thereof. Inputs to the fracking optimization machine learning-model 140 may additionally include cleansed reservoir datum described above. The output of the fracking optimization machine learning-model 140 may include, without limitation, optimal production parameter 144, and the like thereof. Optimal production parameter 144 may include production parameter. Fracking optimization machine-learning model 140 may be trained using production training data 136 described above in this disclosure. Production training data 136 may be retrieved from data store 128. Retrieving production training data 136 from data store 128 may include querying reservoir datum and its corresponding optimal production parameters 144. In some embodiments, fracking optimization machine learning model 140 may include a neural network. In some embodiments, production training data 136 may be generated before receipt of a surface reservoir datum.

With continued reference to FIG. 1, processor 104 is further configured to determine an optimal production parameter 144 as a function of trained fracking optimization machine-learning model 140. In some embodiments, processor 104 may be configured to create machine-learning model such as, without limitation, fracking optimization machine-learning model 140 using techniques for development of linear regression models. Linear regression models may include ordinary least squares regression, which aims to minimize the square of the difference between predicted outcomes and actual outcomes according to an appropriate norm for measuring such a difference (e.g., a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm mounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g., a quadratic, cubic or higher-order equation) providing a best predicted output/actual output fit is sought; similar methods to those described above may be applied to minimize error functions, as will be apparent to persons skilled in the art upon reviewing the entirety of this disclosure. In a non-limiting example, fracking optimization machine-learning may take reservoir datum from the user and output one or more optimal production parameter using one or more underlying regression model within fracking optimization machine-learning model 140.

With continued reference to FIG. 1, in some embodiments, processor 104 may be configured to receive a surface target reservoir datum from a minimum sensor suite. As used in this disclosure, a "surface target reservoir datum" is data point collected at or near the surface of the earth that are indicative of the conditions within a target reservoir/well (for hydraulic fracturing operations). As used herein, a "minimum sensor suite" is a sensing device including a surface sensor. In some embodiments, all sensors of a sensing device may be surface sensors. In some embodiments, a minimum sensor suite includes a surface sensor, and does not include a downhole sensor. In some cases, minimum sensor suite may include a streamlined collection of sensors strategically selected to capture essential data from the surface (e.g., surface pressure, flow rate, temperature, acoustic signals, among others). In a non-limiting example, surface target reservoir datum may include a snapshot of the current operational condition above ground containing one or more key operational metrics that are directly observable or inferable from surface-level measurements. Processor 104 may be configured to determine one or more optimal production parameters 144 using the trained fracking optimization machine learning model 140 upon receiving surface target reservoir datum. In an embodiment, feature extraction may be applied to identified correlational patterns to identify key features from surface and downhole reservoir datums that are most predictive of optimal production parameters 144. In a non-limiting example, processor 104 may be configured to transform production training data into a set of features (e.g., a feature map) that are weighted more for fracking optimization machine learning model 140 training and optimal production parameter determination. Additionally, or alternatively, fracking optimization machine learning model 140 may be adapted to work with different kinds of input, for example, from combined surface and downhole data to surface data or downhole data alone. In an embodiment, feature extraction may identify features that are common or particularly informative across both domains. As a non-limiting example, processor 104 may further utilize transfer learning by highlighting aspects of plurality of reservoir datums that enable fracking optimization machine learning model 140 to apply "knowledge" learned from one domain to another. Exemplary techniques used for feature extractions as described herein may include, without limitation, principal component analysis (PCA), autoencoders, and/or any domain-specific methods that leverage expert knowledge. Such trained fracking optimization machine learning model 140 may be configured to receive surface reservoir datum as an input and determine one or more optimal production parameters 144 as outputs.

With continued reference to FIG. 1, In some embodiments, optimal production parameter may be determined using fuzzy logic. Machine learning model, such as fracking optimization machine-learning model 140, may be implemented as a fuzzy inferencing system described in more detail with reference to FIG. 5. As used in the current disclosure, a "fuzzy inference" is a method that interprets the values in the input vector (i.e., reservoir datum 116 and optimal production parameter 144.) and, based on a set of rules, assigns values to the output vector. A fuzzy set may also be used to show degree of match between fuzzy sets may be used to rank one resource against another. For instance, if both excessive reservoir datum 116 and production parameter have fuzzy sets, optimal production parameter 144 may be determined by having a degree of overlap exceeding a predetermined threshold.

With continued reference to FIG. 1., a processor 104 may determine optimal production parameter using a using a lookup table. A "lookup table," for the purposes of this disclosure, is an array of data that maps input values to output values. A lookup table may be used to replace a runtime computation with an array indexing operation. In another non limiting example, an optimal production parameter 144 look up table may be able to correlate reservoir datum 116 such as, without limitation, pre-fracking reservoir datum, post-fracking reservoir datum, fluid parameter 120, downhole condition 124, and the like to an optimal production parameter 144. Processor 104 may be configured to "lookup" one or more reservoir datum 116 in order to find a corresponding optimal production parameter 144.

Still referring to FIG. 1, in some embodiments, apparatus 100 may determine optimal production parameter 144 using a surface reservoir datum and fracking optimization machine learning model 140. In some embodiments, apparatus 100 may receive a surface reservoir datum from a minimum sensor suite. In some embodiments, apparatus 100 may determine optimal production parameter 144 by inputting into the fracking optimization machine learning model 140 a surface reservoir datum and receiving as an output from fracking optimization machine learning model 140 optimal production parameter 144. As used herein, a "surface reservoir datum" is a reservoir datum captured using a surface sensor. In some embodiments, a surface reservoir datum may be received from a minimum sensor suite.

Still referring to FIG. 1, in some embodiments, fracking optimization machine learning model 140 may be retrained. As used herein, a machine learning model is "retrained" when an adjustment is made to the machine learning model. Fracking optimization machine learning model 140 may be retrained using a reinforcement learning algorithm. Fracking optimization machine learning model 140 may be retrained using a cost function, where the cost function is based on a production metric. As used herein, a "production metric" is a datum describing resource extraction performed as a function of an optimal production parameter. A production metric may include, in non-limiting examples, a resource extraction rate of a resource extraction node, an absolute amount of resource extracted over a resource extraction node's lifetime, an amount of resource extracted from a reservoir by a resource extraction node relative to the total amount of resource in the reservoir, and an extraction rate based on the amount of resource extracted in a time period relative to the total resource in a reservoir. In some embodiments, a production metric is based on expected production. For example, a production metric may be high if a resource node exceeds expected production and may be low if a resource node does not meet expected production.

With continued reference to FIG. 1, processor 104 is further configured to generate an optimal production plan 152 as a function of the optimal production parameter 116. As used herein, an "optimal production plan" is a plan for production of an examined well formulated based on an optimal production parameter. In some embodiments, optimal production plan 152 may include an optimal fracking stimulation process. As used in this disclosure, an "optimal fracking stimulation process" is a process of hydraulic fracture stimulation activity to produce the maximum amount of natural resource during the production of the well. Optimal fracking stimulation process may include at least an optimal fracking stimulation step, wherein the at least an optimal fracking stimulation step is a sub-process of optimal fracking stimulation process. In some cases, optimal fracking stimulation step may be selected from a plurality of fracking stimulation steps of fracking process with replacement of optimized parameter such as, without limitation, optimal production parameter 144 by the processor 104. In a non-limiting example, optimal production plan 152 may include an optimal fracking fluid, wherein the optimal fracking fluid may include, as a non-limiting example, 90% of water, 9.5% of sand, 0.5% of proppant (i.e., acid, friction reducer, surfactant, gelling agent, cross-linker, buffers, and the like thereof). Optimal production plan 152 may further include an optimal fracking stimulation process for hydraulic facture stimulation, wherein the optimal fracking stimulation process may include an optimal fracking stimulation step of pumping optimal fracking fluid at an optimal fracking fluid pressure down at a steel cased well line to an optimal depth with an optimal hole size, and wherein the optimal fracking fluid pressure, the optimal depth, and the optimal hole size may be optimal production parameters.

In some embodiments, processor 104 may be further configured to generate a production plan classifier 148 and classify optimal production parameter 144 to an optimal production plan 152 using the production plan classifier 148.

Production plan classifier 148 may be consistent with the classifiers discussed herein below in FIG. 2. A production plan classifier may be configured to categorize optimal production parameter 144. Categories may include optimal production plan 152, production difficulty, well conditions, and the like thereof. Production plan classifier 148 may be trained using production plan training data. In some cases, production plan training data may include reservoir datum 116, optimal production parameter 144, production plan, optimal production plan 152 and the like thereof. In a non-limiting example, production plan training data may include a plurality of optimal production parameters as input correlated to a plurality of optimal production plans as output. As used in this disclosure, a "classifier" is a machine-learning model, such as a mathematical model, neural net, or program generated by a machine learning algorithm known as a "classification algorithm," as described in further detail below, that sort inputs into categories or bins of data, outputting the categories or bins of data and/or labels associated therewith. A classifier may be configured to output at least a datum that labels or otherwise identifies a set of data that are clustered together, found to be close under a distance metric as described below, or the like. Processor 104 and/or another device may generate a classifier using a classification algorithm, defined as a process whereby a processor 104 derives a classifier from training data. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers.

With continued reference to FIG. 1, in some embodiments, processor 104 may be configured to generate machine learning model such as, without limitation, production plan classifier 148, using a Naïve Bayes classification algorithm. Naïve Bayes classification algorithm generates classifiers by assigning class labels to problem instances, represented as vectors of element values. Class labels are drawn from a finite set. Naïve Bayes classification algorithm may include generating a family of algorithms that assume that the value of a particular element is independent of the value of any other element, given a class variable. Naïve Bayes classification algorithm may be based on Bayes Theorem expressed as $P(A/B)=P(B/A)\ P(A)=P(B)$, where $P(A/B)$ is the probability of hypothesis A given data B also known as posterior probability; $P(B/A)$ is the probability of data B given that the hypothesis A was true; $P(A)$ is the probability of hypothesis A being true regardless of data also known as prior probability of A; and $P(B)$ is the probability of the data regardless of the hypothesis. A naïve Bayes algorithm may be generated by first transforming training data into a frequency table. Processor 104 may then calculate a likelihood table by calculating probabilities of different data entries and classification labels. Processor 104 may utilize a naïve Bayes equation to calculate a posterior probability for each class. A class containing the highest posterior probability is the outcome of prediction. Naïve Bayes classification algorithm may include a gaussian model that follows a normal distribution. Naïve Bayes classification algorithm may include a multinomial model that is used for discrete counts. Naïve Bayes classification algorithm may include a Bernoulli model that may be utilized when vectors are binary.

With continued reference to FIG. 1, in some embodiments, processor 104 may be configured to generate machine learning model such as, without limitation, production plan classifier 148, using a K-nearest neighbors (KNN) algorithm. A "K-nearest neighbors algorithm" as used in this disclosure, includes a classification method that utilizes feature similarity to analyze how closely out-of-sample-features resemble training data to classify input data to one or more clusters and/or categories of features as represented in training data; this may be performed by representing both training data and input data in vector forms, and using one or more measures of vector similarity to identify classifications within training data, and to determine a classification of input data. K-nearest neighbors algorithm may include specifying a K-value, or a number directing the classifier to select the k most similar entries training data to a given sample, determining the most common classifier of the entries in the database, and classifying the known sample; this may be performed recursively and/or iteratively to generate a classifier that may be used to classify input data as further samples. For instance, an initial set of samples may be performed to cover an initial heuristic and/or "first guess" at an output and/or relationship, which may be seeded, without limitation, using expert input received according to any process as described herein. As a non-limiting example, an initial heuristic may include a ranking of associations between inputs and elements of training data. Heuristic may include selecting some number of highest-ranking associations and/or training data elements.

With continued reference to FIG. 1, generating k-nearest neighbors algorithm may generate a first vector output containing a data entry cluster, generating a second vector output containing an input data, and calculate the distance between the first vector output and the second vector output using any suitable norm such as cosine similarity, Euclidean distance measurement, or the like. Each vector output may be represented, without limitation, as an n-tuple of values, where n is at least two values. Each value of n-tuple of values may represent a measurement or other quantitative value associated with a given category of data, or attribute, examples of which are provided in further detail below; a vector may be represented, without limitation, in n-dimensional space using an axis per category of value represented in n-tuple of values, such that a vector has a geometric direction characterizing the relative quantities of attributes in the n-tuple as compared to each other. Two vectors may be considered equivalent where their directions, and/or the relative quantities of values within each vector as compared to each other, are the same; thus, as a non-limiting example, a vector represented as [5, 10, 15] may be treated as equivalent, for purposes of this disclosure, as a vector represented as [1, 2, 3]. Vectors may be more similar where their directions are more similar, and more different where their directions are more divergent; however, vector similarity may alternatively or additionally be determined using averages of similarities between like attributes, or any other measure of similarity suitable for any n-tuple of values, or aggregation of numerical similarity measures for the purposes of loss functions as described in further detail below. Any vectors as described herein may be scaled, such that each vector represents each attribute along an equivalent scale of values. Each vector may be "normalized," or divided by a "length" attribute, such as a length attribute/as derived using a Pythagorean norm: where $a_i$ is attribute number experience of the vector. Scaling and/or normalization may function to make vector comparison independent of absolute quantities of attributes, while preserving any dependency on similarity of attributes; this may, for instance, be advantageous where cases represented in training data are represented by different quantities of samples, which may result in proportionally equivalent vectors with divergent values.

Figure 2:
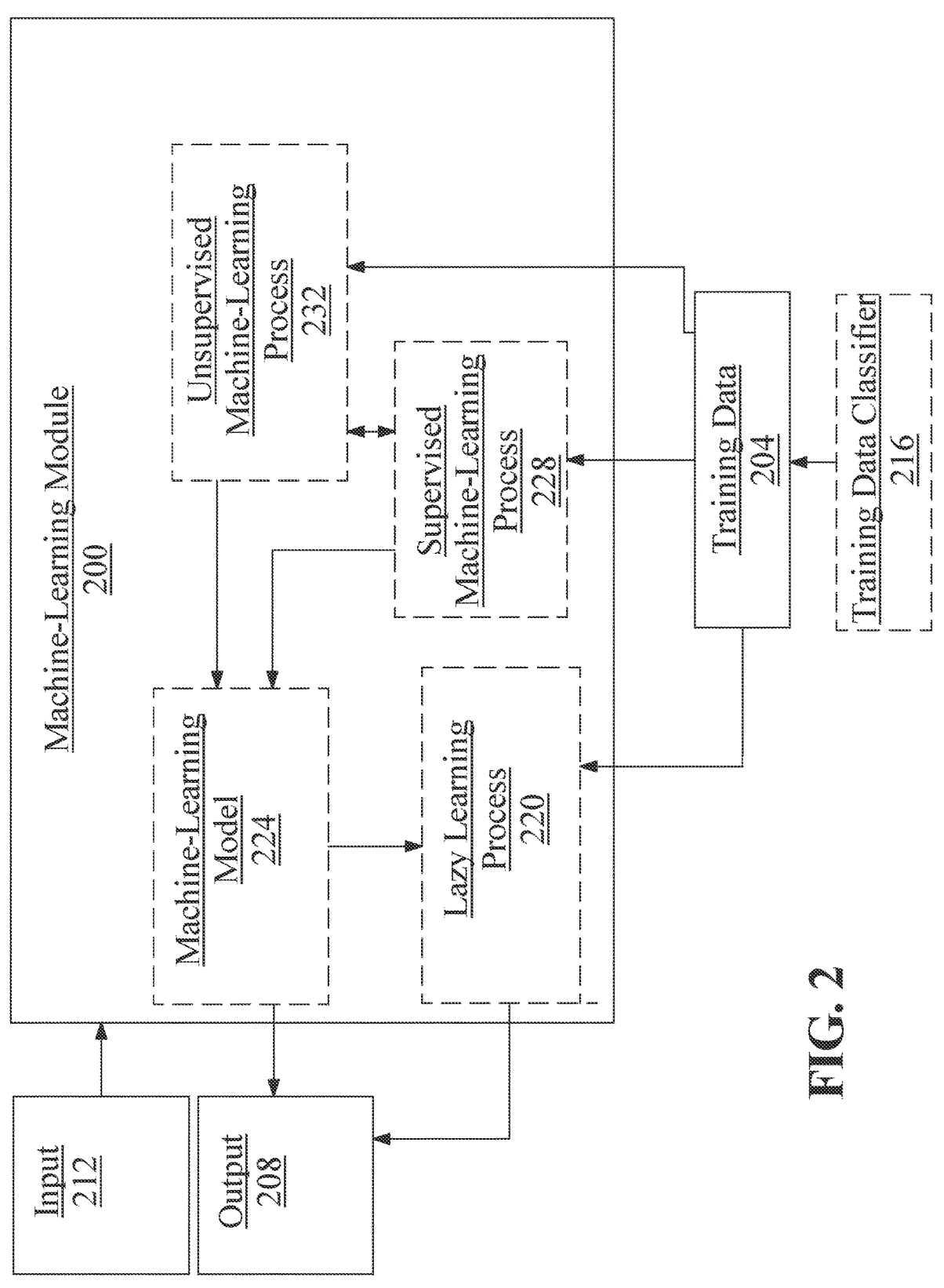
FIG. 2 is a block diagram of an exemplary machine-learning process.

Referring now to FIG. 2, an exemplary embodiment of a machine-learning module 200 that may perform one or more machine-learning processes as described in this disclosure is illustrated. Machine-learning module may perform determinations, classification, and/or analysis steps, methods, processes, or the like as described in this disclosure using machine learning processes. A "machine learning process," as used in this disclosure, is a process that automatedly uses training data 204 to generate an algorithm that will be performed by a computing device/module to produce outputs 208 given data provided as inputs 212; this is in contrast to a non-machine learning software program where the commands to be executed are determined in advance by a user and written in a programming language. Machine-learning module 200 may include training data 204. Training data 204 may include a plurality of data entries, each entry representing a set of data elements that were recorded, received, and/or generated together; data elements may be correlated by shared existence in a given data entry, by proximity in a given data entry, or the like. Multiple data entries in training data 204 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 204 according to various correlations; correlations may indicate causative and/or predictive links between categories of data elements, which may be modeled as relationships such as mathematical relationships by machine-learning processes as described in further detail below. Training data 204 may be formatted and/or organized by categories of data elements, for instance by associating data elements with one or more descriptors corresponding to categories of data elements. As a non-limiting example, training data 204 may include data entered in standardized forms by persons or processes, such that entry of a given data element in a given field in a form may be mapped to one or more descriptors of categories. Elements in training data 204 may be linked to descriptors of categories by tags, tokens, or other data elements; for instance, and without limitation, training data 204 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively, or additionally, and continuing to refer to FIG. 2, training data 204 may include one or more elements that are not categorized; that is, training data 204 may not be formatted or contain descriptors for some elements of data. Machine-learning algorithms and/or other processes may sort training data 204 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 204 to be made applicable for two or more distinct machine-learning algorithms as described in further detail below. Training data 204 used by machine-learning module 200 may correlate any input data as described in this disclosure to any output data as described in this disclosure.

Further referring to FIG. 2, training data may be filtered, sorted, and/or selected using one or more supervised and/or unsupervised machine-learning processes and/or models as described in further detail below; such models may include without limitation a training data classifier 216. Training data classifier 216 may include a "classifier," which as used in this disclosure is a machine-learning model as defined below, such as a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. Machine-learning module 200 may generate a classifier using a classification algorithm, defined as a process whereby a computing device and/or any module and/or component operating thereon derives a classifier from training data 204. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers.

Still referring to FIG. 2, machine-learning module 200 may be configured to perform a lazy-learning process 220 and/or protocol, which may alternatively be referred to as a "lazy loading" or "call-when-needed" process and/or protocol, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 204. Heuristic may include selecting some number of highest-ranking associations and/or training data 204 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively, or additionally, and with continued reference to FIG. 2, machine-learning processes as described in this disclosure may be used to generate machine-learning models 224. A "machine-learning model," as used in this disclosure, is a mathematical and/or algorithmic representation of a relationship between inputs and outputs, as generated using any machine-learning process including without limitation any process as described above and stored in memory; an input is submitted to a machine-learning model 224 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 224 may be generated by creating an artificial neural network, such as a convolutional neural network comprising an input layer of nodes, one or more intermediate layers, and an output layer of nodes. Connections between nodes may be created via the process of "training" the network, in which elements from a training data 204 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 2, machine-learning algorithms may include at least a supervised machine-learning process 228. At least a supervised machine-learning process 228, as defined herein, include algorithms that receive a training set relating a number of inputs to a number of outputs, and seek to find one or more mathematical relations relating inputs to outputs, where each of the one or more mathematical relations is optimal according to some criterion specified to the algorithm using some scoring function. For instance, a supervised learning algorithm may include a reservoir datum 116 and optimal production parameter 144 as described above as inputs, autonomous functions as outputs, and a scoring function representing a desired form of relationship to be detected between inputs and outputs; scoring function may, for instance, seek to maximize the probability that a given input and/or combination of elements inputs is associated with a given output to minimize the probability that a given input is not associated with a given output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 204. Persons skilled in the art, upon reviewing the entirety of this disclosure, will be aware of various possible variations of at least a supervised machine-learning process 228 that may be used to determine relation between inputs and outputs. Supervised machine-learning processes may include classification algorithms as defined above.

Further referring to FIG. 2, machine learning processes may include at least an unsupervised machine-learning processes 232. An unsupervised machine-learning process, as used herein, is a process that derives inferences in datasets without regard to labels; as a result, an unsupervised machine-learning process may be free to discover any structure, relationship, and/or correlation provided in the data. Unsupervised processes may not require a response variable; unsupervised processes may be used to find interesting patterns and/or inferences between variables, to determine a degree of correlation between two or more variables, or the like.

Still referring to FIG. 2, machine-learning module 200 may be designed and configured to create a machine-learning model 224 using techniques for development of linear regression models. Linear regression models may include ordinary least squares regression, which aims to minimize the square of the difference between predicted outcomes and actual outcomes according to an appropriate norm for measuring such a difference (e.g., a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g., a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 2, machine-learning algorithms may include, without limitation, linear discriminant analysis. Machine-learning algorithm may include quadratic discriminate analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors algorithms. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized tress, AdaBoost, gradient tree boosting, and/or voting classifier methods. Machine-learning algorithms may include neural net algorithms, including convolutional neural net processes.

Figure 3:
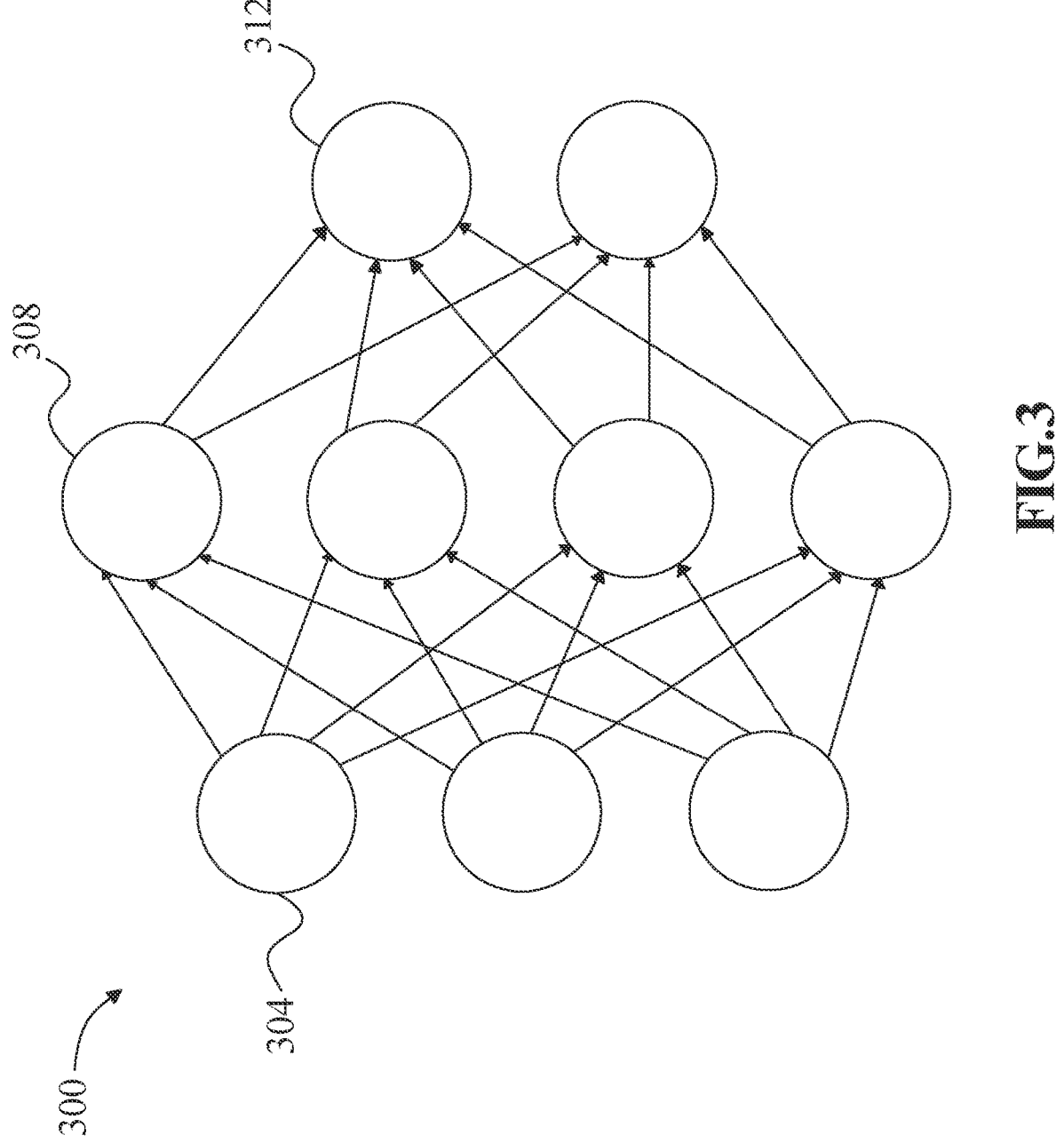
FIG. 3 is a diagram of an exemplary embodiment of neural network.

Referring now to FIG. 3, an exemplary embodiment of neural network 300 is illustrated. A neural network 300 also known as an artificial neural network, is a network of "nodes," or data structures having one or more inputs, one or more outputs, and a function determining outputs based on inputs. Such nodes may be organized in a network, such as without limitation a convolutional neural network, including an input layer of nodes 304, one or more intermediate layers 308, and an output layer of nodes 312. Connections between nodes may be created via the process of "training" the network, in which elements from a training dataset are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning. Connections may run solely from input nodes toward output nodes in a "feed-forward" network or may feed outputs of one layer back to inputs of the same or a different layer in a "recurrent network." As a further non-limiting example, a neural network may include a convolutional neural network comprising an input layer of nodes, one or more intermediate layers, and an output layer of nodes. A "convolutional neural network," as used in this disclosure, is a neural network in which at least one hidden layer is a convolutional layer that convolves inputs to that layer with a subset of inputs known as a "kernel," along with one or more additional layers such as pooling layers, fully connected layers, and the like.

Figure 4:
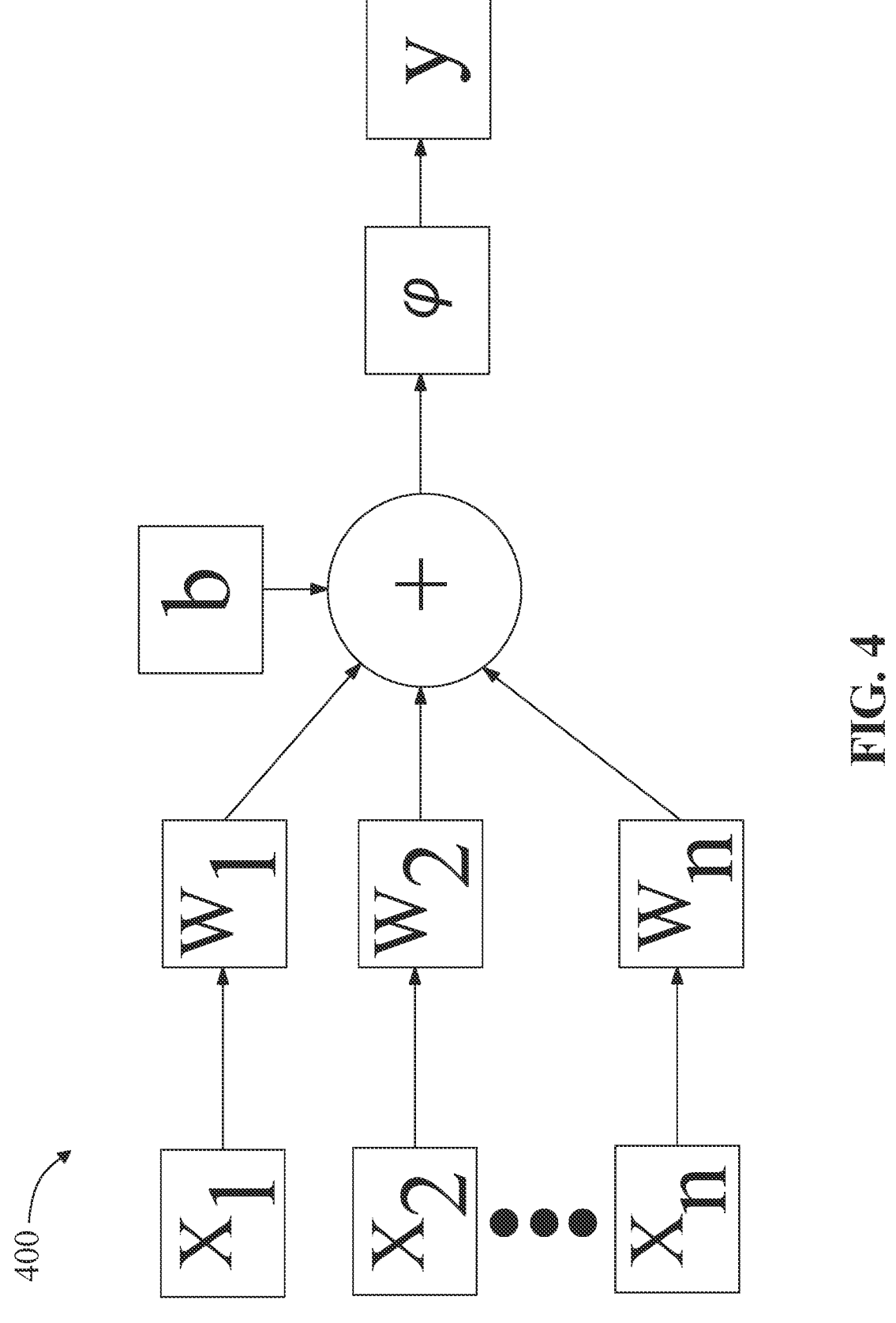
FIG. 4 is a diagram of an exemplary embodiment of a node of a neural network.

Referring now to FIG. 4, an exemplary embodiment of a node of a neural network is illustrated. A node may include, without limitation a plurality of inputs $x_i$ that may receive numerical values from inputs to a neural network containing the node and/or from other nodes. Node may perform a weighted sum of inputs using weights $w_i$ that are multiplied by respective inputs $x_i$. Additionally, or alternatively, a bias b may be added to the weighted sum of the inputs such that an offset is added to each unit in the neural network layer that is independent of the input to the layer. The weighted sum may then be input into a function $\varphi$, which may generate one or more outputs y. Weight $w_i$ applied to an input $x_i$ may indicate whether the input is "excitatory," indicating that it has strong influence on the one or more outputs y, for instance by the corresponding weight having a large numerical value, and/or a "inhibitory," indicating it has a weak effect influence on the one more inputs y, for instance by the corresponding weight having a small numerical value. The values of weights $w_i$ may be determined by training a neural network using training data, which may be performed using any suitable process as described above.

Figure 5:
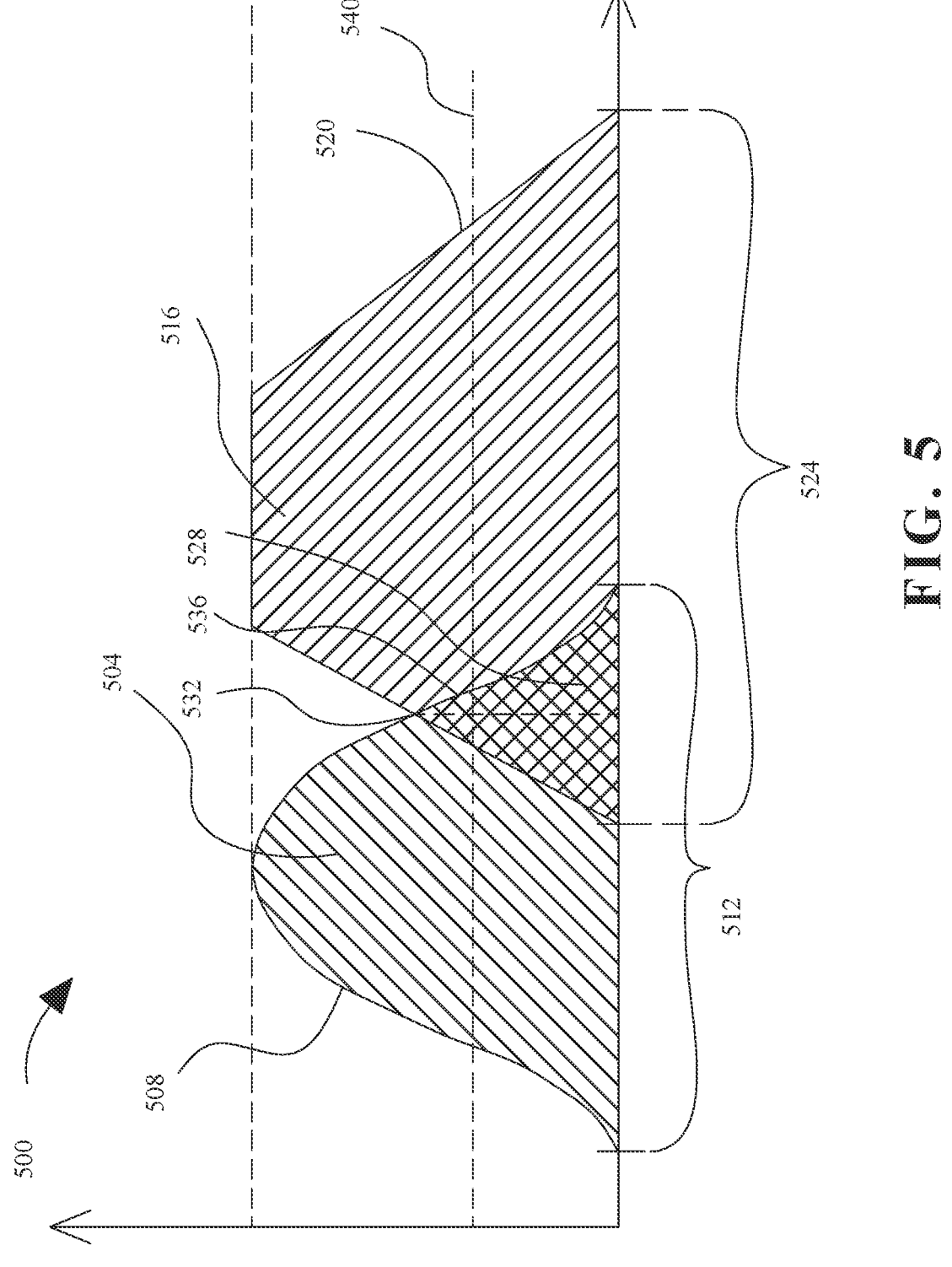
FIG. 5 is a schematic diagram illustrating an exemplary embodiment of a fuzzy inferencing system.

Referring to FIG. 5, an exemplary embodiment of fuzzy set comparison 500 is illustrated. A first fuzzy set 504 may be represented, without limitation, according to a first membership function 508 representing a probability that an input falling on a first range of values 512 is a member of the first fuzzy set 504, where the first membership function 508 has values on a range of probabilities such as without limitation the interval [0,1], and an area beneath the first membership function 508 may represent a set of values within first fuzzy set 504. Although first range of values 512 is illustrated for clarity in this exemplary depiction as a range on a single number line or axis, first range of values 512 may be defined on two or more dimensions, representing, for instance, a Cartesian product between a plurality of ranges, curves, axes, spaces, dimensions, or the like. First membership function 508 may include any suitable function mapping first range 512 to a probability interval, including without limitation a triangular function defined by two linear elements such as line segments or planes that intersect at or below the top of the probability interval. As a non-limiting example, triangular membership function may be defined as:

$$y(x, a, b, c) = \begin{cases} 0, & \text{for } x > c \text{ and } x < a \\ \frac{x-a}{b-a}, & \text{for } a \le x < b \\ \frac{c-x}{c-b}, & \text{if } b < x \le c \end{cases}$$

a trapezoidal membership function may be defined as:

$$y(x, a, b, c, d) = \max\left(\min\left(\frac{x-a}{b-a}, 1, \frac{d-x}{d-c}\right), 0\right)$$

a sigmoidal function may be defined as:

$$y(x, a, c) = \frac{1}{1 - e^{-a(x-c)}}$$

a Gaussian membership function may be defined as:

$$y(x, c, \sigma) = e^{-\frac{1}{2}\left(\frac{x-c}{\sigma}\right)^2}$$

and a bell membership function may be defined as:

$$y(x, a, b, c,) = \left[1 + \left|\frac{x-c}{a}\right|^{2b}\right]^{-1}$$

Persons skilled in the art, upon reviewing the entirety of this disclosure, will be aware of various alternative or additional membership functions that may be used consistently with this disclosure.

Still referring to FIG. 5, first fuzzy set 504 may represent any value or combination of values as described above, including output from one or more machine-learning models, such as, without limitation, fracking optimization machine-learning model, production plan classifier, and the like. A second fuzzy set 516, which may represent any value which may be represented by first fuzzy set 504, may be defined by a second membership function 520 on a second range 524; second range 524 may be identical and/or overlap with first range 512 and/or may be combined with first range via Cartesian product or the like to generate a mapping permitting evaluation overlap of first fuzzy set 504 and second fuzzy set 516. Where first fuzzy set 504 and second fuzzy set 516 have a region 528 that overlaps, first membership function 508 and second membership function 520 may intersect at a point 532 representing a probability, as defined on probability interval, of a match between first fuzzy set 504 and second fuzzy set 516. Alternatively, or additionally, a single value of first and/or second fuzzy set may be located at a locus 536 on first range 512 and/or second range 524, where a probability of membership may be taken by evaluation of first membership function 508 and/or second membership function 520 at that range point.

A probability at 528 and/or 532 may be compared to a threshold 540 to determine whether a positive match is indicated. Threshold 540 may, in a non-limiting example, represent a degree of match between first fuzzy set 504 and second fuzzy set 516, and/or single values therein with each other or with either set, which is sufficient for purposes of the matching process; for instance, threshold may indicate a sufficient degree of overlap between an output from one or more machine-learning models and/or optimal production parameter and a predetermined class, such as without limitation reservoir datum categorization, for combination to occur as described above. Alternatively, or additionally, each threshold may be tuned by a machine-learning and/or statistical process, for instance and without limitation as described in further detail below.

Further referring to FIG. 5, in an embodiment, a degree of match between fuzzy sets may be used to classify an optimal production parameter with reservoir datum. For instance, if a reservoir datum has a fuzzy set matching optimal production parameter fuzzy set by having a degree of overlap exceeding a threshold, processor 104 may classify the optimal production parameter as belonging to the reservoir datum categorization. Where multiple fuzzy matches are performed, degrees of match for each respective fuzzy set may be computed and aggregated through, for instance, addition, averaging, or the like, to determine an overall degree of match.

Still referring to FIG. 5, in an embodiment, an optimal production parameter may be compared to multiple reservoir datum categorization fuzzy sets. For instance, optimal production parameter may be represented by a fuzzy set that is compared to each of the multiple reservoir datum categorization fuzzy sets; and a degree of overlap exceeding a threshold between the optimal production parameter fuzzy set and any of the multiple reservoir datum categorization fuzzy sets may cause processor 104 to classify the optimal production parameter as belonging to reservoir datum categorization. For instance, in one embodiment there may be two reservoir datum categorization fuzzy sets, representing respectively reservoir datum categorization and a reservoir datum categorization. First reservoir datum categorization may have a first fuzzy set; Second reservoir datum categorization may have a second fuzzy set; and optimal production parameter may have an optimal production parameter fuzzy set. Processor 104, for example, may compare an optimal production parameter fuzzy set with each of reservoir datum categorization fuzzy set and in reservoir datum categorization fuzzy set, as described above, and classify an optimal production parameter to either, both, or neither of reservoir datum categorization or in reservoir datum categorization. Machine-learning methods as described throughout may, in a non-limiting example, generate coefficients used in fuzzy set equations as described above, such as without limitation x, c, and σ of a Gaussian set as described above, as outputs of machine-learning methods. Likewise, optimal production parameter may be used indirectly to determine a fuzzy set, as optimal production parameter fuzzy set may be derived from outputs of one or more machine-learning models that take the optimal production parameter directly or indirectly as inputs.

Still referring to FIG. 5, a computing device may use a logic comparison program, such as, but not limited to, a fuzzy logic model to determine a reservoir datum response. An reservoir datum response may include, but is not limited to, measuring reservoir datum, calculating production parameter, and the like; each such reservoir datum response may be represented as a value for a linguistic variable representing reservoir datum response or in other words a fuzzy set as described above that corresponds to a degree of degree of match of optimal production parameter as calculated using any statistical, machine-learning, or other method that may occur to a person skilled in the art upon reviewing the entirety of this disclosure. In other words, a given element of a first optimal production parameter may have a first non-zero value for membership in a first linguistic variable value such as a first optimal production parameter and a second non-zero value for membership in a second linguistic variable value such as a second optimal production parameter. In some embodiments, determining a reservoir datum categorization may include using a linear regression model. A linear regression model may include a machine learning model. A linear regression model may be configured to map data of optimal production parameter, such as degree of . . . to one or more reservoir datum parameters. A linear regression model may be trained using a machine learning process. A linear regression model may map statistics such as, but not limited to, quality of optimal production parameter, and the like. In some embodiments, determining a reservoir datum of optimal production parameter may include using a reservoir datum classification model. A reservoir datum classification model may be configured to input collected data and cluster data to a centroid based on, but not limited to, frequency of appearance, linguistic indicators of quality, and the like. Centroids may include scores assigned to them such that quality of . . . of optimal production parameter may each be assigned a score. In some embodiments reservoir datum classification model may include a K-means clustering model. In some embodiments, reservoir datum classification model may include a particle swarm optimization model. In some embodiments, determining the reservoir datum of an optimal production parameter may include using a fuzzy inference engine. A fuzzy inference engine may be configured to map one or more optimal production parameter data elements using fuzzy logic. In some embodiments, optimal production parameter may be arranged by a logic comparison program into reservoir datum arrangement. A "reservoir datum arrangement" as used in this disclosure is any grouping of objects and/or data based on skill level and/or output score. This step may be implemented as described above in FIGS. 1-4. Membership function coefficients and/or constants as described above may be tuned according to classification and/or clustering algorithms. For instance, and without limitation, a clustering algorithm may determine a Gaussian or other distribution of questions about a centroid corresponding to a given level, and an iterative or other method may be used to find a membership function, for any membership function type as described above, that minimizes an average error from the statistically determined distribution, such that, for instance, a triangular or Gaussian membership function about a centroid representing a center of the distribution that most closely matches the distribution. Error functions to be minimized, and/or methods of minimization, may be performed without limitation according to any error function and/or error function minimization process and/or method as described in this disclosure.

Further referring to FIG. 5, an inference engine may be implemented according to input and/or output membership functions and/or linguistic variables. For instance, a first linguistic variable may represent a first measurable value pertaining to optimal production parameter, such as a degree of match of an element, while a second membership function may indicate a degree of in reservoir datum of a subject thereof, or another measurable value pertaining to optimal production parameter. Continuing the example, an output linguistic variable may represent, without limitation, a score value. An inference engine may combine rules, such as: "if the number of optimal production is 'high' and the production priority level is 'high', the production difficulty is 'hard'"—the degree to which a given input function membership matches a given rule may be determined by a triangular norm or "T-norm" of the rule or output membership function with the input membership function, such as min (a, b), product of a and b, drastic product of a and b, Hamacher product of a and b, or the like, satisfying the rules of commutativity $(T(a, b)=T(b, a))$, monotonicity: $(T(a, b)\leq T(c, d)$ if $a\leq c$ and $b\leq d)$, (associativity: $T(a, T(b, c))=T(T(a, b), c))$, and the requirement that the number 1 acts as an identity element. Combinations of rules ("and" or "or" combination of rule membership determinations) may be performed using any T-conorm, as represented by an inverted T symbol or "$\perp$" such as max (a, b), probabilistic sum of a and b $(a+b-a*b)$, bounded sum, and/or drastic T-conorm; any T-conorm may be used that satisfies the properties of commutativity: $\perp(a, b)=\perp(b, a)$, monotonicity: $\perp(a, b)\leq\perp(c, d)$ if $a\leq c$ and $b\leq d$, associativity: $\perp(a, \perp(b, c))=\perp(\perp(a, b), c)$, and identity element of 0. Alternatively, or additionally T-conorm may be approximated by sum, as in a "product-sum" inference engine in which T-norm is product and T-conorm is sum. A final output score or other fuzzy inference output may be determined from an output membership function as described above using any suitable defuzzification process, including without limitation Mean of Max defuzzification, Centroid of Area/Center of Gravity defuzzification, Center Average defuzzification, Bisector of Area defuzzification, or the like. Alternatively, or additionally, output rules may be replaced with functions according to the Takagi-Sugeno-King (TSK) fuzzy model.

Referring now to FIG. 6, an exemplary method 600 for fracking optimization is shown. Method 600 includes a step 605 of receiving, by at least a processor, a reservoir datum from at least a sensing device, without limitation, as described above in reference to FIGS. 1-5. Sensing device may be any sensing device and/or computing device described in this disclosure. In some embodiments, sensing device may include a seismic sensor. This may be implemented, without limitation, as described above in reference to FIGS. 1-5. In some embodiments, reservoir datum may include a pre-fracking reservoir datum and a post-fracking reservoir datum. In some embodiments, reservoir datum may include a fluid parameter. In some embodiments, reservoir datum may include a downhole condition. This may be implemented, without limitation, as described above in reference to FIGS. 1-5.

With continued reference to FIG. 6, method 600 further includes a step 610 of generating, by the at least a processor, production training data comprises a plurality of reservoir datum correlated to a plurality of optimal production parameters as output, without limitation, as described above in reference to FIGS. 1-5. In some embodiments, step 610 of generating production training data may include applying a fracking simulation model as a function of the reservoir datum and calculating an optimal production parameter as a function of the fracking simulation model. This may be implemented, without limitation, as described above in reference to FIGS. 1-5. In other embodiments, step 610 of generating the production training data may include converting the reservoir datum and the optimal production parameter into a cleansed data format using a data conversion module, wherein the cleansed data format comprises a cleansed reservoir datum and a cleansed optimal production parameter. This may be implemented, without limitation, as described above in reference to FIGS. 1-5.

With continued reference to FIG. 6, method 600 further includes a step 615 of training, by the at least a processor, a fracking optimization machine model using the production training data, without limitation, as described above in reference to FIGS. 1-5.

With continued reference to FIG. 6, method 600 further includes a step 620 of determining, by the at least a processor, an optimal production parameter as a function of the fracking optimization machine-learning model, without limitation, as described above in reference to FIGS. 1-5. In some embodiments, without limitation, optimal production parameter may be determined using a fuzzy logic. This may be implemented, without limitation, as described above in reference to FIGS. 1-5.

With continued reference to FIG. 6, method 600 may further includes a step 625 of generating, by the at least a processor, an optimal production plan as a function of the optimal production parameter, without limitation, as described above in reference to FIGS. 1-5. In some embodiments, step 625 of generating the optimal production plan may include generating a production plan classifier and classifying the optimal production parameter to an optimal production plan using the production plan classifier. This may be implemented, without limitation, as described above in reference to FIGS. 1-5. In some embodiments, optimal production plan may include an optimal fracking stimulation process, wherein the optimal fracking stimulation process may include at least an optimal fracking stimulation step. This may be implemented, without limitation, as described above in reference to FIGS. 1-5.

Figure 7:
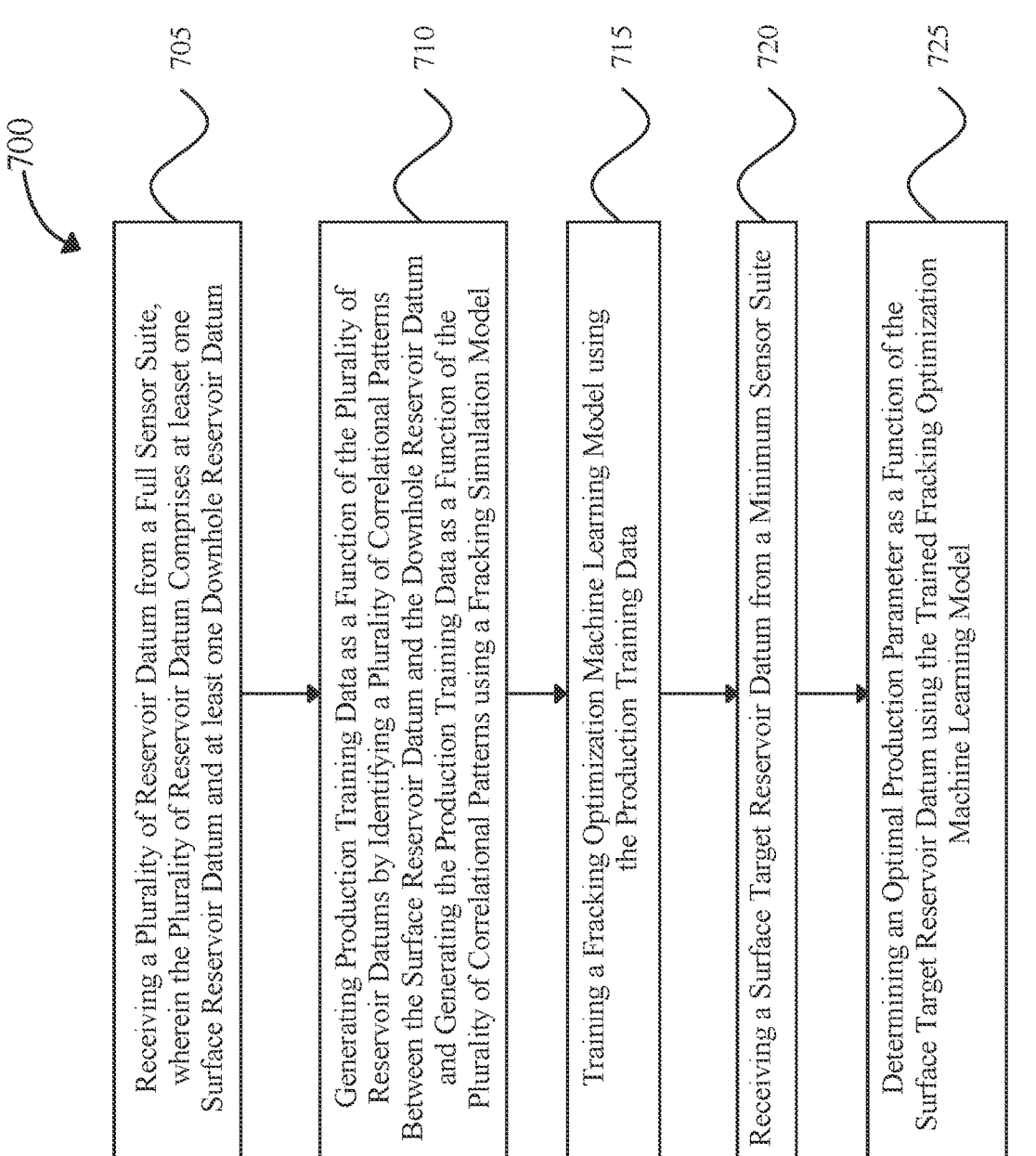
FIG. 7 is a flow diagram of an exemplary method for fracking optimization.

Referring now to FIG. 7, an exemplary embodiment of a method 700 of fracking optimization is illustrated. One or more steps if method 700 may be implemented, without limitation, as described with reference to other figures. One or more steps of method 700 may be implemented, without limitation, using at least a processor.

Still referring to FIG. 7, in some embodiments, method 700 may include receiving a plurality of reservoir datum from a full sensor suite, wherein the plurality of reservoir datums includes at least one surface reservoir datum detected using a first sensor of the full sensor suite and at least one downhole reservoir datum detected using a second sensor of the full sensor suite 705. In some embodiments, the first sensor of the full sensor suite includes a surface sensor, and the second sensor of the full sensor suite includes downhole sensor and a surface sensor. In some embodiments, wherein the minimum sensor suite includes the surface sensor, and does not include the downhole sensor.

Still referring to FIG. 7, in some embodiments, method 700 may include generating production training data as a function of the plurality of reservoir datum by identifying a plurality of correlational patterns between the at least one surface reservoir datum and the at least one downhole reservoir datum and generating the production training data as a function of the plurality of correlational patterns using a fracking simulation model 710. In some embodiments, the fracking simulation model is configured to calculate a fracture propagation using a linear elastic fracture mechanism, wherein the linear elastic fracture mechanism comprises a criterion comprising an evaluation of a plurality of reservoir data, wherein the evaluation of a plurality of reservoir data includes a maximum tensile stress criterion; a minimum strain energy density criterion; a maximum principal strain criterion; and a maximum strain criterion. In some embodiments, generating the production training data includes converting the downhole reservoir datum into a cleansed data format using a data conversion module.

Still referring to FIG. 7, in some embodiments, method 700 may include training a fracking optimization machine learning model using the production training data 715. In some embodiments, the fracking optimization machine learning model includes a neural network.

Still referring to FIG. 7, in some embodiments, method 700 may include receiving a surface target reservoir datum from a minimum sensor suite 720.

Still referring to FIG. 7, in some embodiments, method 700 may include determining an optimal production parameter, wherein determining the optimal production parameter comprises inputting, into the fracking optimization machine learning model, the surface target reservoir datum; and receiving, as an output from the fracking optimization machine learning model, the optimal production parameter 725. In some embodiments, determining the optimal production parameter does not include analysis of the surface reservoir datum using the fracking simulation model.

In some embodiments, method 700 further includes receiving a reservoir analysis datum; and generating the production training data as a function of the reservoir analysis datum. In some embodiments, the production training data is generated before receipt of the surface reservoir datum.

In some embodiments, method 700 further includes generating an optimal production plan as a function of the optimal production parameter. In some embodiments, method 700 further includes retraining the fracking optimization machine learning model as a function of a production metric.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random-access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 8:
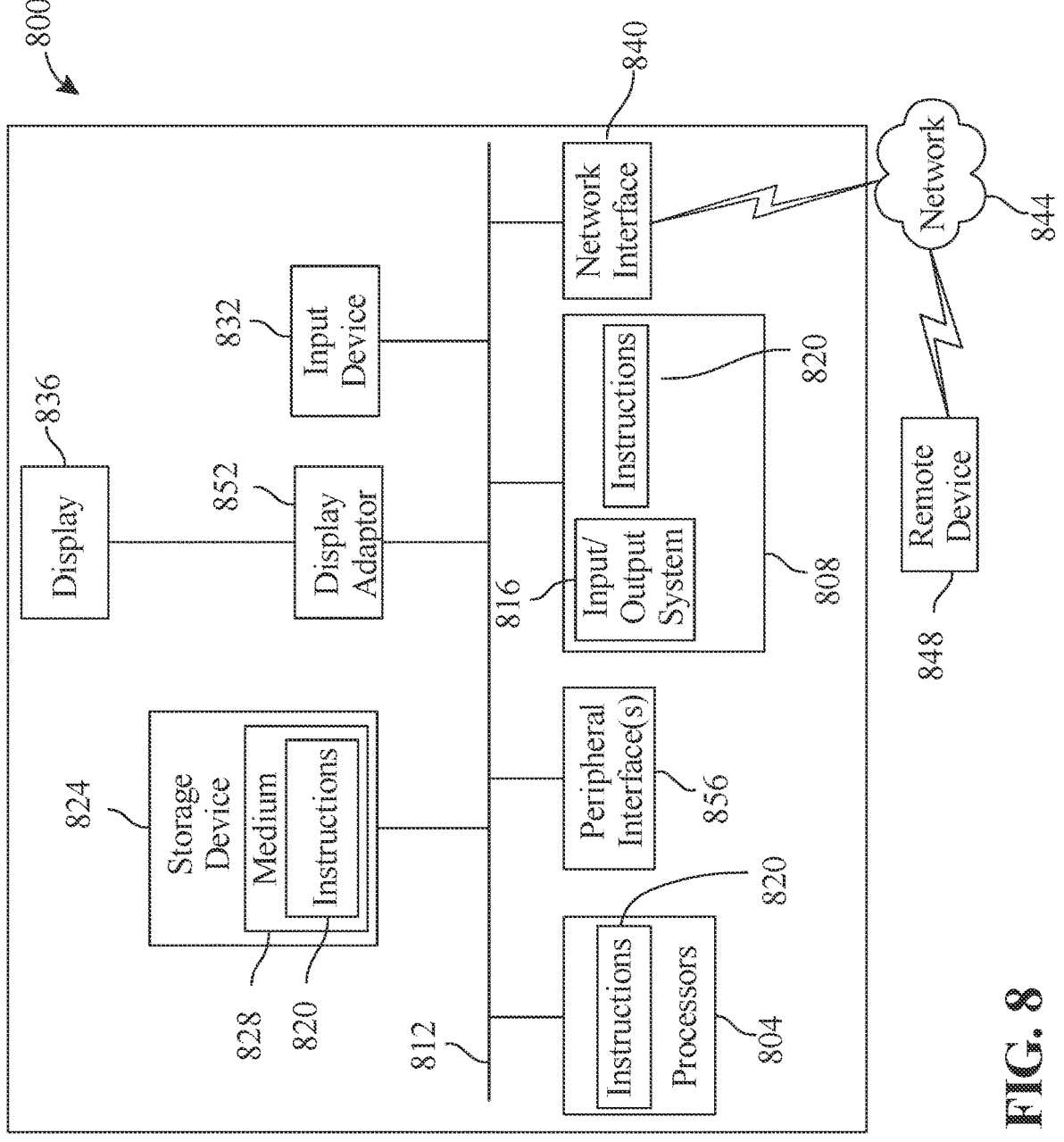
FIG. 8 is a block diagram of a computing system that can be used to implement any one or more of the methodologies disclosed herein and any one or more portions thereof.

FIG. 8 shows a diagrammatic representation of one embodiment of a computing device in the exemplary form of a computer system 800 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 800 includes a processor 804 and a memory 808 that communicate with each other, and with other components, via a bus 812. Bus 812 may include any of several types of bus structures including, but not limited to, a memory bus, a memory controller, a peripheral bus, a local bus, and any combinations thereof, using any of a variety of bus architectures.

Processor 804 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 804 may be organized according to Von Neumann and/or Harvard architecture as a non-limiting example. Processor 804 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating-point unit (FPU), and/or system on a chip (SoC).

Memory 808 may include various components (e.g., machine-readable media) including, but not limited to, a random-access memory component, a read only component, and any combinations thereof. In one example, a basic input/output system 816 (BIOS), including basic routines that help to transfer information between elements within computer system 800, such as during start-up, may be stored in memory 808. Memory 808 may also include (e.g., stored on one or more machine-readable media) instructions (e.g., software) 820 embodying any one or more of the aspects and/or methodologies of the present disclosure. In another example, memory 808 may further include any number of program modules including, but not limited to, an operating system, one or more application programs, other program modules, program data, and any combinations thereof.

Computer system 800 may also include a storage device 824. Examples of a storage device (e.g., storage device 824) include, but are not limited to, a hard disk drive, a magnetic disk drive, an optical disc drive in combination with an optical medium, a solid-state memory device, and any combinations thereof. Storage device 824 may be connected to bus 812 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 824 (or one or more components thereof) may be removably interfaced with computer system 800 (e.g., via an external port connector (not shown)). Particularly, storage device 824 and an associated machine-readable medium 828 may provide nonvolatile and/or volatile storage of machine-readable instructions, data structures, program modules, and/or other data for computer system 800. In one example, software 820 may reside, completely or partially, within machine-readable medium 828. In another example, software 820 may reside, completely or partially, within processor 804.

Computer system 800 may also include an input device 832. In one example, a user of computer system 800 may enter commands and/or other information into computer system 800 via input device 832. Examples of an input device 832 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 832 may be interfaced to bus 812 via any of a variety of interfaces (not shown) including, but not limited to, a serial interface, a parallel interface, a game port, a USB interface, a FIREWIRE interface, a direct interface to bus 812, and any combinations thereof. Input device 832 may include a touch screen interface that may be a part of or separate from display 836, discussed further below. Input device 832 may be utilized as a user selection device for selecting one or more graphical representations in a graphical interface as described above.

A user may also input commands and/or other information to computer system 800 via storage device 824 (e.g., a removable disk drive, a flash drive, etc.) and/or network interface device 840. A network interface device, such as network interface device 840, may be utilized for connecting computer system 800 to one or more of a variety of networks, such as network 844, and one or more remote devices 848 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 844, may employ a wired and/or a wireless mode of communication. In general, any network topology may be used. Information (e.g., data, software 820, etc.) may be communicated to and/or from computer system 800 via network interface device 840.

Computer system 800 may further include a video display adapter 852 for communicating a displayable image to a display device, such as display device 836. Examples of a display device include, but are not limited to, a liquid crystal display (LCD), a cathode ray tube (CRT), a plasma display, a light emitting diode (LED) display, and any combinations thereof. Display adapter 852 and display device 836 may be utilized in combination with processor 804 to provide graphical representations of aspects of the present disclosure. In addition to a display device, computer system 800 may include one or more other peripheral output devices including, but not limited to, an audio speaker, a printer, and any combinations thereof. Such peripheral output devices may be connected to bus 812 via a peripheral interface 856. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods, systems, and software according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

The invention claimed is:

1. An apparatus for fracking optimization, wherein the apparatus comprises:

at least a processor and a memory communicatively connected to the processor, the memory containing instructions configuring the processor to:

receive a plurality of reservoir datums from a sensor suite, wherein the plurality of reservoir datums comprises:

at least one surface reservoir datum detected using a first sensor of the sensor suite; and at least one downhole reservoir datum detected using a second sensor of the sensor suite;

generate production training data as a function of the plurality of reservoir datums, wherein generating the production training data comprises:

processing the at least one downhole reservoir datum into a standardized data format using a data conversion module;

obtaining at least one fracking simulation model output, wherein the fracking simulation model is configured to calculate at least one of: rock deformation, reservoir pressure, fracture propagation, fluid flow in a fracture; and correlating the plurality of reservoir datums with the at least one fracking simulation model output to generate the production training data;

train a fracking optimization machine learning model using the pro duction training data, wherein the fracking optimization machine learning model is configured to predict the at least one fracking simulation model output without requiring execution of the fracking simulation model;

receive a surface target reservoir datum from a sensor suite; and determine a fracking production parameter in real-time using the surface target reservoir datum and the trained fracking optimization machine learning model without requiring execution of the fracking simulation model.

2. The apparatus of claim 1, wherein the fracking optimization machine learning model is configured to predict at least one of: fracture height, fracture width, fracture length, and fracture conductivity as the at least one fracking simulation model output.

3. The apparatus of claim 1, wherein the memory further contains instructions configuring the processor to:

predict, using the fracking optimization machine learning model, a likelihood of fracturing into a nearby wellbore based on the surface target reservoir datum.

4. The apparatus of claim 1, wherein the memory further contains instructions configuring the processor to:

generate a well spacing plan based on the fracking production parameter determined using the fracking optimization machine learning model.

5. The apparatus of claim 1, wherein the fracking optimization machine learning model is trained to map between the plurality of reservoir datums as inputs and the at least one fracking simulation model output as outputs, thereby eliminating a need for executing the fracking simulation model during real-time operations.

6. The apparatus of claim 1, wherein the fracking production parameter comprises at least one of: optimal drilling depth, optimal well location, optimal proximity of fractures, optimal quantity of fractures, optimal fracking fluid pressure, and optimal fracking fluid flow rates.

7. The apparatus of claim 1, wherein the fracking simulation model is configured to calculate fracture propagation using at least one fracture mechanics criterion, wherein the at least one fracture mechanics criterion comprises an evaluation of a plurality of reservoir datums.

8. The apparatus of claim 1, wherein the fracking simulation model is configured to simulate fluid flow in a fracture by implementing a fluid dynamics model that relates fluid parameters and downhole conditions to pressure gradient along the fracture, and wherein the fracking optimization machine learning model is trained to predict this fluid flow without executing the fracking simulation model.

9. The apparatus of claim 1, wherein the fracking simulation model is configured to calculate rock deformation as a function of reservoir datum using a rock behavior model, and wherein the fracking optimization machine learning model is trained to predict this rock deformation without executing the fracking simulation model.

10. A method for fracking optimization, comprising:

receiving, by at least a processor, a plurality of reservoir datums from a sensor suite, wherein the plurality of reservoir datums comprises:

at least one surface reservoir datum detected using a first sensor of the sensor suite; and at least one downhole reservoir datum detected using a second sensor of the sensor suite;

generating, by the at least a processor, production training data as a function of the plurality of reservoir datums, wherein generating the production training data comprises:

processing the at least one downhole reservoir datum into a standardized data format using a data conversion module;

obtaining at least one fracking simulation model output, wherein the fracking simulation model is configured to calculate at least one of: rock deformation, reservoir pressure, fracture propagation, fluid flow in a fracture; and correlating the plurality of reservoir datums with the at least one fracking simulation model output to generate the production training data;

training, by the at least a processor, a fracking optimization machine learning model using the production training data, wherein the fracking optimization machine learning model is configured to predict the at least one fracking simulation model output without requiring execution of the fracking simulation model;

receiving, by the at least a processor, a surface target reservoir datum from a sensor suite; and determining, by the at least a processor, a fracking production parameter in real-time using the surface target reservoir datum and the trained fracking optimization machine learning model without requiring execution of the fracking simulation model.

11. The method of claim 10, wherein the fracking optimization machine learning model is configured to predict at least one of: fracture height, fracture width, fracture length, and fracture conductivity as the at least one fracking simulation model output.

12. The method of claim 10, further comprising:

predicting, by the at least a processor using the fracking optimization machine learning model, a likelihood of fracturing into a nearby wellbore based on the surface target reservoir datum.

13. The method of claim 10, further comprising:

generating, by the at least a processor, a well spacing plan based on the fracking production parameter determined using the fracking optimization machine learning model.

14. The method of claim 10, wherein the fracking optimization machine learning model is trained to map between the plurality of reservoir datums as inputs and the at least one fracking simulation model output as outputs, thereby eliminating a need for executing the fracking simulation model during real-time operations.

15. The method of claim 10, wherein the fracking production parameter comprises at least one of: optimal drilling depth, optimal well location, optimal proximity of fractures, optimal quantity of fractures, optimal fracking fluid pressure, and optimal fracking fluid flow rates.

16. The method of claim 10, wherein the fracking simulation model is configured to calculate fracture propagation using at least one fracture mechanics criterion, wherein the at least one fracture mechanics criterion comprises an evaluation of a plurality of reservoir datums.

17. The method of claim 10, wherein the fracking simulation model is configured to simulate fluid flow in a fracture by implementing a fluid dynamics model that relates fluid parameters and downhole conditions to pressure gradient along the fracture, and wherein the fracking optimization machine learning model is trained to predict this fluid flow without executing the fracking simulation model.

18. The method of claim 10, wherein the fracking simulation model is configured to calculate rock deformation as a function of reservoir datum using a rock behavior model, and wherein the fracking optimization machine learning model is trained to predict this rock deformation without executing the fracking simulation model.

19. A non-transitory computer-readable storage medium storing instructions that, when executed by at least one processor, cause the at least one processor to perform operations for fracking optimization, the operations comprising:

receiving a plurality of reservoir datums from a sensor suite, wherein the plurality of reservoir datums comprises:

at least one surface reservoir datum detected using a first sensor of the sensor suite; and at least one downhole reservoir datum detected using a second sensor of the sensor suite;

generating production training data as a function of the plurality of reservoir datums, wherein generating the production training data comprises:

processing the at least one downhole reservoir datum into a standardized data format using a data conversion module;

obtaining at least one fracking simulation model output, wherein the fracking simulation model is configured to calculate at least one of: rock deformation, reservoir pressure, fracture propagation, fluid flow in a fracture; and correlating the plurality of reservoir datums with the at least one fracking simulation model output to generate the production training data;

training a fracking optimization machine learning model using the production training data, wherein the fracking optimization machine learning model is configured to predict the at least one fracking simulation model output without requiring execution of the fracking simulation model;

receiving a surface target reservoir datum from a sensor suite; and determining a fracking production parameter in real-time using the surface target reservoir datum and the trained fracking optimization machine learning model without requiring execution of the fracking simulation model.

20. The non-transitory computer-readable storage medium of claim 19, wherein the operations further comprise:

predicting, using the fracking optimization machine learning model, a likelihood of fracturing into a nearby wellbore based on the surface target reservoir datum;

generating a well spacing plan based on the fracking production parameter determined using the fracking optimization machine learning model;

wherein the fracking optimization machine learning model is configured to predict at least one of fracture height, fracture width, fracture length, and fracture conductivity as the at least one fracking simulation model output;

wherein the fracking production parameter comprises at least one of optimal drilling depth, optimal well location, optimal proximity of fractures, optimal quantity of fractures, optimal fracking fluid pressure, and optimal fracking fluid flow rates;

wherein the fracking simulation model is configured to calculate fracture propagation using at least one fracture mechanics criterion, simulate fluid flow in a fracture by implementing a fluid dynamics model that relates fluid parameters and downhole conditions to pressure gradient along the fracture, and calculate rock deformation as a function of reservoir datum using a rock behavior model; and wherein the fracking optimization machine learning model is trained to predict the fracture propagation, fluid flow, and rock deformation without executing the fracking simulation model, thereby eliminating a need for executing the fracking simulation model during real-time operations.

* * * * *